United States Patent
Arumugam

(10) Patent No.: US 11,680,970 B2
(45) Date of Patent: *Jun. 20, 2023

(54) METHODS AND SYSTEMS FOR POSITION AND ORIENTATION SENSING IN NON-LINE-OF-SIGHT ENVIRONMENTS USING COMBINED DECOUPLED QUASISTATIC MAGNETIC AND ELECTRIC FIELDS

(71) Applicant: California Institute of Technology, Pasadena, CA (US)

(72) Inventor: Darmindra D. Arumugam, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/700,116

(22) Filed: Mar. 21, 2022

(65) Prior Publication Data
US 2022/0276291 A1 Sep. 1, 2022

Related U.S. Application Data

(63) Continuation of application No. 17/087,546, filed on Nov. 2, 2020, now Pat. No. 11,313,892.
(Continued)

(51) Int. Cl.
*G01R 29/08* (2006.01)
*G01S 1/70* (2006.01)
*G01R 29/14* (2006.01)

(52) U.S. Cl.
CPC ..... *G01R 29/0814* (2013.01); *G01R 29/0878* (2013.01); *G01R 29/0892* (2013.01); *G01R 29/14* (2013.01); *G01S 1/70* (2013.01)

(58) Field of Classification Search
CPC ............ G01R 29/0814; G01R 29/0878; G01R 29/0892; G01R 29/14; G01S 1/70; G01S 5/00; G01S 11/12
(Continued)

(56) References Cited

U.S. PATENT DOCUMENTS 4,314,251 A * 2/1982 Raab .................. G01S 1/08
340/979
6,703,829 B2 3/2004 Tola
(Continued)

FOREIGN PATENT DOCUMENTS

JP 5191975 B2 5/2013
WO 93/11426 A1 6/1993

OTHER PUBLICATIONS

Haus, Hermann A.; Melcher, James R. (1989). "Magnetoquasistatic Fields: Superposition Integral and Boundary Value Points of View". *Electromagnetic Fields and Energy*. Prentice Hall. p. 310-370. ISBN 978-0-13-249020-7. ( https://o cw.mit.edu/resources/res-6-001-electromagnetic-fields-and-energy-spr.
(Continued)

*Primary Examiner* — Christopher P McAndrew
(74) *Attorney, Agent, or Firm* — Steinfl + Bruno, LLP

(57) ABSTRACT

Orientation and position sensing methods and devices are disclosed. The described methods and devices are based on implementing magneto-electric-quasi-static fields for position and orientation sensing in lossy-dielectric, conducting, or metallic non-line-of-sight environments, where obstructions or occlusions or nearby objects exists that are lossy in nature and that typically perturb radio or electromagnetic wave signaling. Detailed experimental results highlighting the performance of the disclosed methods are also presented.

32 Claims, 23 Drawing Sheets

Related U.S. Application Data

(60) Provisional application No. 62/967,118, filed on Jan. 29, 2020, provisional application No. 62/931,141, filed on Nov. 5, 2019.

(58) Field of Classification Search
 USPC .......................................................... 324/144
 See application file for complete search history.

(56) References Cited

U.S. PATENT DOCUMENTS

| | | |
|---|---|---|
| 7,423,553 B2 | 9/2008 | Yokokohji et al. |
| 7,844,415 B1 | 11/2010 | Bryant et al. |
| 10,244,421 B2 | 3/2019 | Rawlins |
| 11,313,892 B2 | 4/2022 | Arumugam |
| 2004/0021461 A1 | 2/2004 | Goldfine et al. |
| 2006/0267833 A1* | 11/2006 | Langford ............ G01S 5/02524 342/174 |
| 2017/0067941 A1 | 3/2017 | Hegedus |
| 2018/0287262 A1 | 10/2018 | Patri et al. |
| 2019/0130630 A1 | 5/2019 | Ackerson et al. |

OTHER PUBLICATIONS

Non-Final Office Action for U.S. Appl. No. 16/987,205, filed Aug. 6, 2020 on behalf of California Institute of Technology dated Mar. 23, 2022 43 pages.

Non-Final Office Action issued for U.S. Appl. No. 16/215,546, filed Dec. 10, 2018, on behalf of California Institute of Technology, dated Mar. 3, 2022. 16 Pages.

Notice of Allowance issued for U.S. Appl. No. 16/215,546, filed Dec. 10, 2018, on behalf of California Institute of Technology, dated Jul. 27, 2022. 10 Pages.

* cited by examiner

| C value | Mean Error | Max Error |
|---|---|---|
| .5 | 3.7% | 9% |
| 0 | 4.5% | 12% |
| -.5 | 3.4% | 15.14% |

| C Value | Orientation |
|---|---|
| -0.229 | Radial |
| 0.6630 | Vertical |
| 0.0620 | Circumferential |

# METHODS AND SYSTEMS FOR POSITION AND ORIENTATION SENSING IN NON-LINE-OF-SIGHT ENVIRONMENTS USING COMBINED DECOUPLED QUASISTATIC MAGNETIC AND ELECTRIC FIELDS

CROSS REFERENCE TO RELATED APPLICATIONS

The present application is a continuation of U.S. application Ser. No. 17/087,546, filed on Nov. 2, 2020, which claims priority to U.S. Prov. App. No. 62/967,118, filed on Jan. 29, 2020 and U.S. Prov. App. No. 62/931,141, filed on Nov. 5, 2019, all three of which are incorporated herein by reference in their entirety. The present application may be related to U.S. application Ser. No. 16/987,205 filed on Aug. 8, 2020, which is incorporated herein by reference in its entirety.

STATEMENT OF GOVERNMENT GRANT

This invention was made with government support under Grant No. 80NM0018D004 awarded by NASA (JPL). The government has certain rights in the invention.

FIELD

The present disclosure is related to orientation and position sensing, and more particularly to methods and devices implementing decoupled magnetic and electric quasi-static fields which are synthetically combined, referred to for simplicity as Magneto-Electric Quasistatic Systems or abbreviated as MEQS, for position and orientation sensing in conductive, metallic, or more generally, lossy-dielectric, non-line-of-sight (NLoS) environments.

BACKGROUND

Throughout this document the term "magneto-electric-quasi-static fields" is referred to a combination of separate electric-quasi-static fields and magneto-quasi-static fields. These fields are decoupled electromagnetically from each other and do not directly interact with each other, but are generated and combined synthetically to derive accurate error free position and orientation sensing in challenging non-line-of-sight environments (NLoS).

Magneto-quasi-static (MQS) systems have been shown to be very effective for position and orientation sensing in non-line-of-sight (NLoS) environments, however they can exhibit errors of considerable nature when the environments consist of large metals or conductors. It is known that in such environments metals, conductors, or large-scale lossy-dielectrics can distort or attenuate the tracking signals resulting in unacceptable errors in tracking and/or orientation sensing.

SUMMARY

Natural materials react to electric and magnetic fields. When considering quasi-static electric phenomena only, dielectric loss (due to electric conductivity) can be thought as characterization of lossy nature of a material, and materials with high conductivity, σ (in relative sense to dielectric constant multiplied by the radial frequency of the electromagnetic wave, i.e., $\sigma \gg \omega \in$) is considered lossy. In quasi-static fields where both electric and magnetic modes are of interests, electric and magnetic behavior should be taken into account in determining scattered field responses. For position and orientation detection techniques using combined magneto-electric-quasi-static (MEQS) fields, the primary interest is understanding behavior of bulk electric conductors near MEQS fields and how they impact these fields, since bulk electric conductors are most and abundantly present in nature. Bulk electric conductors for lossy nature of quasi-static fields are defined as ones that (1) have electrical conductivity greater than dielectric constant times the electromagnetic (high electric loss tangent), (2) electric loss tangents that dominate over magnetic loss tangents, where loss tangents for both electric or magnetic types are defined as the arctangent of the ratio of imaginary component of permittivity or permeability, respectively, over its real part.

In view of the above, throughout the present disclosure, the term "lossy element" will be defined to encompass a larger category than just conductive and/or metallic elements, thus also inclusive of lossy dielectric elements, and generally as ones that (1) have electrical conductivity greater than dielectric constant times the electromagnetic, (2) electric loss tangents that dominate over magnetic loss tangents.

The disclosed methods, systems and devices address and provide practical solutions to position and orientation sensing in non-line-of-sight environments that may include obstacles, occlusions, or nearby scatterers that are described as lossy elements. The combined approach is based on implementing a combined magneto-electric-quasi-static (MEQS) fields to reduce sources of the errors mentioned in the above. Exemplary MEQS architectures and isolation systems are presented to demonstrate the performance of the disclosed methods.

Further aspects of the disclosure are provided in the description, drawings and claims of the present application.

According to a first aspect of the present disclosure, a non-line-of-sight position sensing method in presence of a lossy element is disclosed, comprising: providing a transmitting device configured to transmit combined magneto-electric-quasi-static fields along one or more transmitting axes; providing a receiving device configured to receive magneto-electric-quasi-static fields along one or more receiving axes; placing the lossy element in between the transmitting device and the receiving device; transmitting through the lossy element, by the transmitting device, the magneto-electric-quasi-static fields in one or more frequency bands; detecting, by the receiving device, the magneto-electric-quasi-static fields, and based on the detected magneto-electric-quasi-static fields, calculating an orientation-invariant range between the receiving device and the transmitting device, wherein the magneto-electric-quasi-static fields include a combination of separate electric-quasi-static fields and magneto-quasi-static fields.

According to a second aspect of a the present disclosure, a non-line-of-sight position sensing method in presence of a lossy element is disclosed, comprising: providing a plurality of transmitting devices configured to transmit magneto-electric-quasi-static fields along a plurality of transmitting axes; providing a plurality of receiving devices configured to receive magneto-electric-quasi-static fields along a plurality of receiving axes; placing the lossy element in between the plurality of transmitting devices and the plurality of receiving devices; transmitting through the lossy element, by the plurality of transmitting devices, the magneto-electric-quasi-static fields in one or more frequency bands; detecting, by the plurality of receiving devices, the magneto-electric-quasi-static fields, and based on the detected magnetoelectric-quasi-static fields, calculating orientation-invariant ranges between the plurality of receiving devices and the plurality of transmitting devices, wherein the magneto-electric-quasi-static includes a combination of separate electric-quasi-static fields and magneto-quasi-static fields.

DESCRIPTION OF THE DRAWINGS

FIG. 5A shows a table summarizing exemplary range errors according to an embodiment of the present disclosure.

FIG. 5E shows exemplary values for a tuning parameter according to an embodiment of the present disclosure.

DETAILED DESCRIPTION

Figure 1:
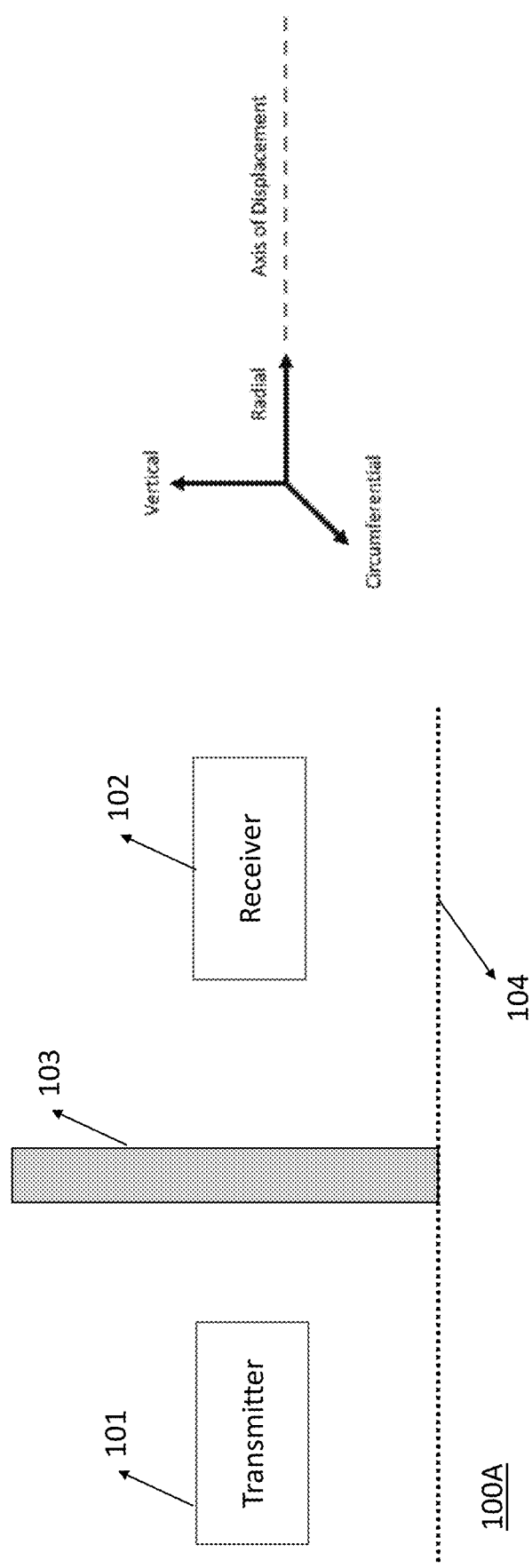
FIG. 1A shows an exemplary measurement arrangement according to an embodiment of the present disclosure.
FIG. 1B shows orientations and related nomenclatures used throughout the text of the disclosure.

Within the quasistatic regime, most dielectrics behave as conducting bodies due to the low frequency of operation, $\sigma \gg \omega \in$, where $\sigma$ is the conductivity, $\omega$ is the radial frequency, and $\in$ is the dielectric permittivity. In behaving as conductors, such dielectrics perturb fields by creating secondary fields that can be described by a series of scattered moments, which are largely described by lower order dipole moments of scattering. These dipole moments are typically represented as image moments. The conductor size modulates the image dipole moments originating at the conductor. These dipole moments are related to image theory in the classical or non-classical sense. In the low frequency limit ($\omega \to 0$) and for electrically small conductors ($\alpha \ll \lambda$, where $\alpha$ is the size or radius of the conductor and $\lambda$ is the wavelength), the shape of the conductors are not critical (e.g. sphere and cubes shaped conductors do not observe a strong difference in response).

Due to quasistatics and the low-frequency limit, the time-derivatives in Faraday's law and Ampere's law are weak and these equations are decoupled. The time-varying magnetic field components are affected by Len's law, whereas the time-varying electric field components are not. Therefore, magnetic fields near the conductor see a negating moment, whereas electric fields near the conductor see an additive moment. According to the teachings of the present disclosure, dipole moments can be used at the conductor as fictitious or mathematical sources or the total fields outside the conductor. As such, for conductors in quasistatics, the dipole moments may be obtained as:

$$\vec{M} = \alpha_m (I \cdot g_H \vec{H}), \alpha_m = -2\pi\alpha^3 = -c \qquad \text{equation (1A)}$$

$$\vec{P} = \alpha_p (I \cdot g_E \vec{E}), \alpha_p = 2\pi\alpha^3 = c \qquad \text{equation (1B)}$$

where $\vec{M}$ and $\vec{P}$ represent the vector magnetic and electric dipole moments respectively, $\alpha$ is the size of the conductor, I is the excitation matrix which has a diagonal form, and $g_H$ is the link gain for the magnetic coupling and $g_E$ is the link gain for the electric coupling. The link gains, $g_H$ and $g_E$ may be measured and accounted for. The description for scattered fields to be described by vector dipole fictitious sources $\vec{M}$ and $\vec{P}$ located at the conductor is accurate in the low frequency limit ($\omega \to 0$) and for electrically small conductors ($\alpha \ll \lambda$). Within this limit, the scalar scattering coefficients $\alpha_m$ and $\alpha_p$ are due to magnetic and electric scattered fields, respectively, and for the same conductor is: (1) dependent on the conductors size, (2) same in magnitude with a differing sign (negative and positive quantities [-c, c], respectively), and (3) independent of the conductivity of the material. The uniqueness (form and sign difference) and similarities of the fictitious sources $\vec{M}$ and $\vec{P}$ that describe scattering of magnetic and electric quasi-static fields provides an important property that can be used to remove artifacts of scattering in electro-magnetic fields completely. The value of removing the artifacts are in use for quasi-static non-line-of-sight (NLoS) position and orientation sensing, where distortions in nearby materials need to be removed to provide accurate readings.

MQS systems refer to use of quasi-static magnetic fields, where an MQS field is generated and detected, and then inverted for position or orientation of the source or detector. EQS systems refer to the same but for quasi-static electric fields instead. In MEQS, both MQS and EQS fields are generated and detected, however the MQS fields and EQS fields are decoupled and do not interact with each other. With respect to implementation, systems can be developed to either simultaneously generate or detect MQS and EQS fields at the same frequency and times, or if greater isolation is needed for practical systems, these can be generated at different frequencies and times, where gain corrections to the field couplings as noted by $g_H$ and $g_E$ would need to be accounted for when different frequencies are used. For MEQS, where both magnetic and electric fields of the scattered fields are captured, the electric component of the scattered fields are due to the image dipole moment $\vec{P}$, whereas the magnetic component of the scattered fields are due to the image dipole moment $\vec{M}$. Since $\vec{M}$ and $\vec{P}$ are opposing to each other, but have the same dipole field form, the summed voltage components due to the scattered MEQS fields may be obtained as:

$$V_S = V_P + V_M = C_E V_E + C_H V_H \qquad \text{equation (2)}$$

where $V_S$ is the total scattered voltage measured, $V_P$ is the scattered voltage due to the electric dipole scattering, and $V_M$ is the scattered voltage due to the magnetic dipole scattering. $V_M$ is simply described by Faraday's law and has the general form:

$$V_M = C_H V_H = C_H \frac{3(\vec{M}\cdot\hat{r})(\vec{n}\cdot\hat{r})-\vec{M}\cdot\vec{n}}{r^3}$$

where $\vec{M}=\alpha_m(I\cdot g_H \vec{H})$, $\vec{H}$ is the incident field from the source, and $g_H=-j\omega\mu/4\pi$, and $C_H$ is an unknown common system gain constant for the MQS couplings. Here $\vec{M}$ is the moment of the scattered field due to the conductor, and $\vec{n}$ is the moment of the magnetic receiver. Due to similar dipole field behavior represented by the duality principle in electromagnetism, $V_E$ has the similar form, given by:

$$V_P = C_E V_E = C_E \frac{3(\vec{P}\cdot\hat{r})(\vec{n}\cdot\hat{r})-\vec{P}\cdot\vec{n}}{r^3}$$

where $\vec{P}=\alpha_p(I\cdot g_E \vec{E})$ is the incident field from the source, and $g_E=1/4\pi\epsilon_0$, and $C_E$ is an unknown common system gain constant for the EQS couplings. Here $\vec{P}$ is the moment of the scattered field due to the conductor, and $\vec{n}$ is the moment of the electric receiver. Parameter $C_{E/H}$ is considered here as a tuning parameter to account for how electric couplings and magnetic couplings may provide differing measured link gain. For theoretical purposes, we assume $C_E=C_H=1$, so that the scattered voltage measured by a MEQS receiver is simply: $V_S = V_E + V_H$, which gives under the context presented above:

$$V_S = V_E + V_H = \frac{3(\vec{P}\cdot\hat{r})(\vec{n}\cdot\hat{r})-\vec{P}\cdot\vec{n}}{r^3} + \frac{3(\vec{M}\cdot\hat{r})(\vec{n}\cdot\hat{r})-\vec{M}\cdot\vec{n}}{r^3}$$

Due to the distributive laws of dot-products, this can be simply re-written as:

$$V_S = \frac{3((c(I\cdot g_E \vec{E}) - c(I\cdot g_H \vec{H}))\cdot\hat{r})(\vec{n}\cdot\hat{r}) - (c(I\cdot g_E \vec{E}) - c(I\cdot g_H \vec{H}))\cdot\vec{n}}{r^3}$$

where c is the constant denoted in Equation 1A and 1B. Further if we assume that the source that generates the EQS and MQS fields are dipolar in nature (electric dipole and magnetic dipole, respectively), then the field $\vec{E}$ and $\vec{H}$ have the same form, noted below for completeness:

$$\vec{E} = \frac{3(\vec{P_s}\cdot\hat{r})(\vec{n}\cdot\hat{r})-\vec{P_s}\cdot\vec{n}}{r^3} \text{ and } \vec{H} = \frac{3(\vec{M_s}\cdot\hat{r})(\vec{n}\cdot\hat{r})-\vec{M_s}\cdot\vec{n}}{r^3}$$

where $\vec{P_S}$ and $\vec{M_S}$ denote the source or generation (not scattered) dipoles for both electric and magnetic sources, respectively. Given the identical forms, it is noted that by proper selection of $g_E$ and $g_H$ gain constants for the source field, such that $g_E\vec{E}=g_H\vec{H}$ one will find that the scattered voltage response detected at the MEQS receiver is a null-vector or zero. To enable this zero-scattered field, the requirements are then stated as:

Source EQS and MQS create de-coupled quasi-static fields that do not interact strongly and with vector electric and magnetic fields that have the same amplitude. Achieve the same amplitude by physical tuning means or simply measurement, then numerical tuning the gain constants $g_E$ and $g_H$ as needed so that $g_E\vec{E}=g_H\vec{H}$ Scattering of the fields are by objects that obey the low frequency limit for electrically small conductors ($\alpha<<\lambda$), which is not very restrictive for long-wavelengths.

The total field received by the MEQS receiver is due to the direct fields from the MEQS source and the scattered field due to interaction with the object occluding or nearby the measurements, and is given by:

$$V_T = V_D + V_S = V_D$$

where $V_S=0$ as noted above for MEQS couplings configured to remove the scattered fields. The total field under MEQS co-located and co-aligned dipole sources and detectors is due to only the direct MEQS field components, and is given simply by:

$$V_T = V_D = g_D \frac{3(\vec{D_s}\cdot\hat{r})(\vec{n}\cdot\hat{r})-\vec{D_s}\cdot\vec{n}}{r^3}$$

where $g_D$ is the link gain of the total field, and $\vec{D_S}=\vec{P_S}+\vec{M_S}$ is the direct MEQS source dipole contributions, where again $\vec{P_S}$ and $\vec{M_S}$ denote the source or generation (not scattered) dipoles for both electric and magnetic sources, respectively.

The total voltage contribution for MEQS co-located and co-aligned dipole sources and detectors is due to only the direct MEQS field components. Dipole sources and detectors in the low-frequency limit ($\omega\to 0$) are simply electrically-small antennas (ESA's) that are commonly known in the antenna theory, defined rigorously by $s<<\lambda$, where s is the physical scale of the ESA and $\lambda$ is the electromagnetic wavelength. Because the form of the total voltage is identical to the voltage coupling in low-frequencies within the quasi-static regime and due to dipole-dipole field couplings (ESA-ESA couplings), the techniques developed in U.S. application Ser. No. 16/987,205 filed on Aug. 8, 2020, incorporated herein by reference in its entirety, can be applied to MEQS sensor technologies to solve for position and orientation.

In what follows, some exemplary measurement results highlighting the performance of the disclosed methods and devices will be presented. For the sake of simplicity, experiments performed in one dimension is described. This is done first in the case of a system including one-axis transmitter and receiver, followed by the case of a system with three orthogonal axis transmitter and receiver.

1. One Dimension, One-Axis System

FIG. 1A shows an exemplary measurement arrangement (100A) in accordance with an embodiment of the present disclosure. The measurement arrangement (100A) of FIG. 1A comprises a transmitter (101), a receiver (102) and a lossy element (103) (e.g. metallic) placed in between transmitter (101) and receiver (102). In accordance with the teachings of the present disclosure, transmitter (101) and receiver (102) are one-axis transmitters and receivers respectively, although as described later in detail, embodiments with three orthogonal axes transmitters and receivers may also be envisaged. The constituents of the transmitter (101) and receiver (102) will be described more in detail later. In order to perform various measurements, first, transmitter (101) and receiver (102) were placed in an open environment without lossy element (103) being present (i.e. line-of-sight). By way of example, transmitter (101) and receiver (102) were placed at a height of 1.52 m above ground (104), and measurements were taken at separation distances of 4 to 20 m. Three different measurements were taken with the transmit/receive pair aligned in orthogonal axis to allow for a complete classification of the problem space. For the sake of clarity, orthogonal axes together with nomenclature used throughout the text are shown in FIG. 1B. As also shown in FIG. 1B, the displacement of transmitter (101) or receiver (102) was performed along the radial axis. The line-of-sight measurements were followed by non-line-of-sight measurement where lossy element (103) was introduced in between the transmitter (101) and receiver (102). Details of both such measurements will be given later in the present disclosure.

Figure 2:
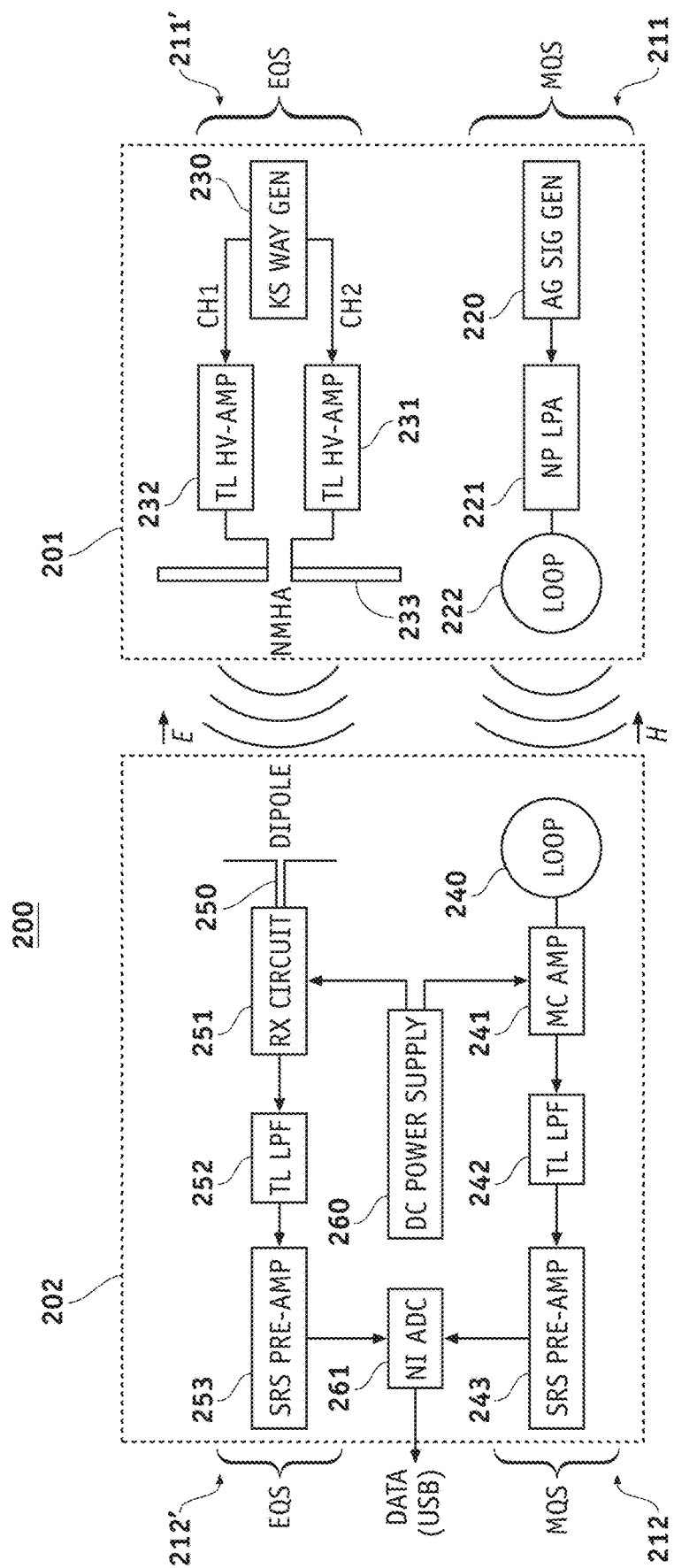
FIG. 2 shows an exemplary measurement arrangement according to an embodiment of the present disclosure.

FIG. 2 shows an exemplary measurement system (200) according to further embodiments of the present disclosure, where more details of exemplary transmitters and receivers that can be implemented as part of the measurement arrangement (100A) of FIG. 1A are illustrated. Measurement system (200) comprises a transmitter (201) and a receiver (202). Transmitter (201) comprises magneto-quasi-static (MQS) transmitter (211) and electro-quasi-static (EQS) transmitter (211'). MQS transmitter (211) comprises a signal generator (220) used to drive loop coil (222) at, for example, 312.4 kHz to generate a magnetic field (MQS). On the other hand, (EQS) transmitter (211') comprises a dual channel waveform generator (230). The two channels of waveform generator (230) may be set to, for example, a frequency of 400 kHz, and one channel may be inverted to allow for the generation of a differential signal. These signals may then be amplified with a high-voltage amplifier (231, 232), providing, for example, a 20× amplification in voltage. This enables a high voltage signal allowing the desired ranges for the embodiment of the figure. As also shown in FIG. 2, EQS transmitter (211') further comprises transmit antenna (233) to transmit electrical signals. According to embodiments of the present disclosure, magneto-quasi-static (MQS) transmitter (211) and electric-quasi-static (EQS) transmitter (211') may transmit magneto-quasi-static and/or electric-quasi-static fields with frequencies in the ranges of tens or hundreds of kHz.

With continued reference to FIG. 2, receiver (202) comprises MQS receiver (212) and EQS receiver (212'). MQS receiver (212) comprises loop coil (240) to measure the magnetic field, and amplifier (241) that may be added in-line to increase the gain of the signal. Downstream of amplifier (241), a passive low-pass filter (242) may be connected in-line to clean the signal, low-pass filter (242) acting as anti-aliasing filter. The signal is then fed to pre-amplifier (243), which applies more gain and conditions the signal before being sampled by analog to digital converter (261). The resulting digital signal may be saved onto a computer for later processing in a data processing software such as MATLAB®.

With further reference to FIG. 2, EQS receiver (212') comprises dipole (250) that may be used to detect the electric field. Dipole (250) comprises two independent arms capturing the field and feeding the signal to the rest of EQS receiver (212'). The differential signal from the two arms of dipole (212') may be converted to a single ended signal for simplicity of measurements. As also shown in FIG. 2, EQS receiver (212') further comprises front-end circuit (251), low-pass filter (252) and pre-amplifier (253). After the differential to single-ended conversion, the signal flow is identical to that of MQS receiver (212), as described previously. According to an embodiment of the present disclosure, EQS transmitter (211) and MQS transmitter (212) may be oriented in parallel directions, and also EQS receiver (212') and MQS receiver (212) may be oriented in parallel directions.

1. A Experimental Results, Line-of-Sight

With reference to FIG. 1A, and as part of the experiment, lossy element (103) was first removed, and magnetic and electric field values were taken from the line of sight experiment and were corrected using the disclosed MEQS concept.

Using the equations described previously, the field values are combined to mitigate any effects due to the deviation of an ideal radiator in free space. Just as a lossy element placed in-between the transmitter and receiver will perturb both field values, the same is true for the ground, which acts like a conductor at frequencies the experiment was conducted.

Figure 3A:
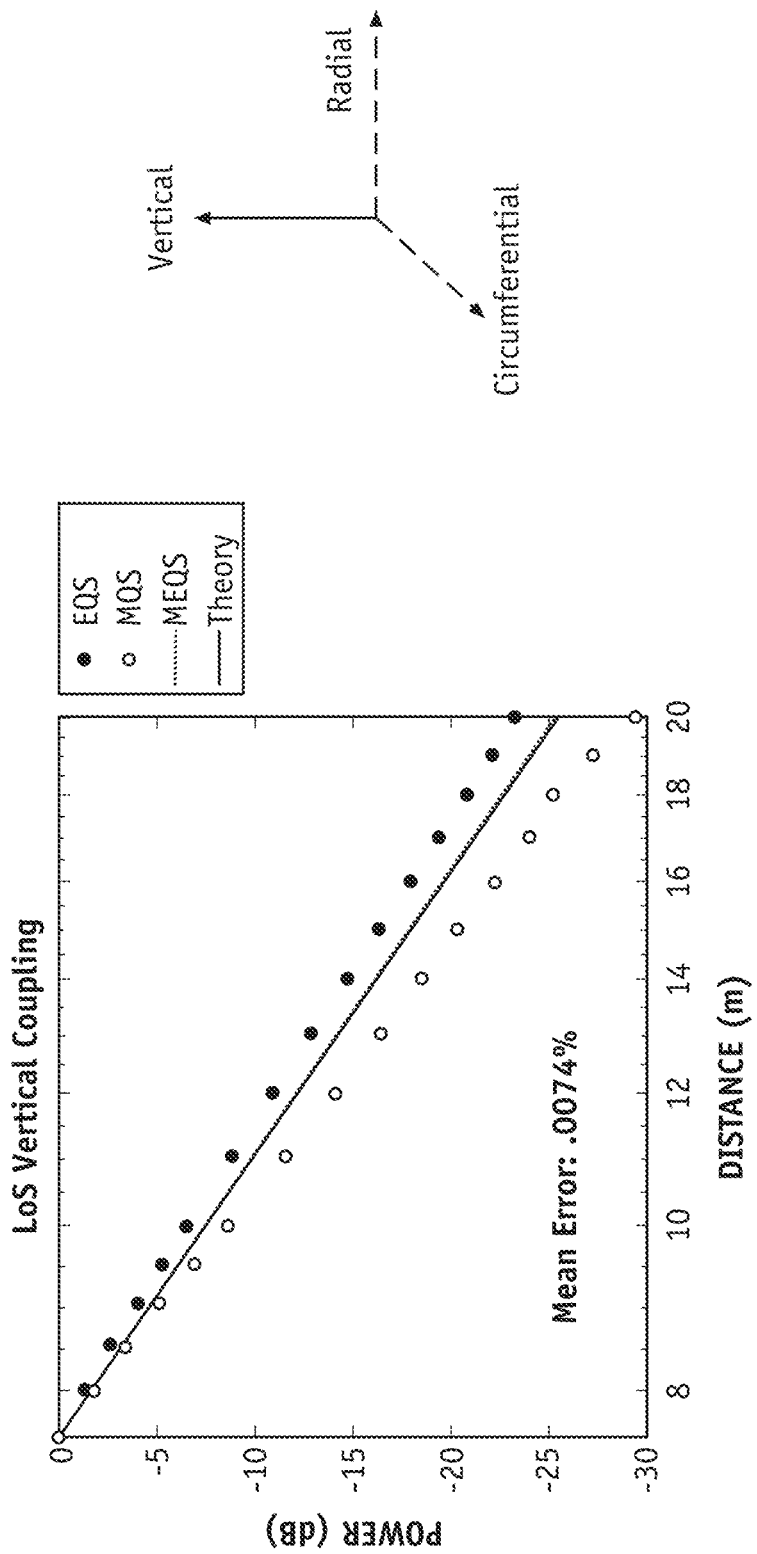
FIGS. 3A-3C show exemplary line-of-sight measurement results for three orthogonal axes according to an embodiment of the present disclosure.
Figure 3B:
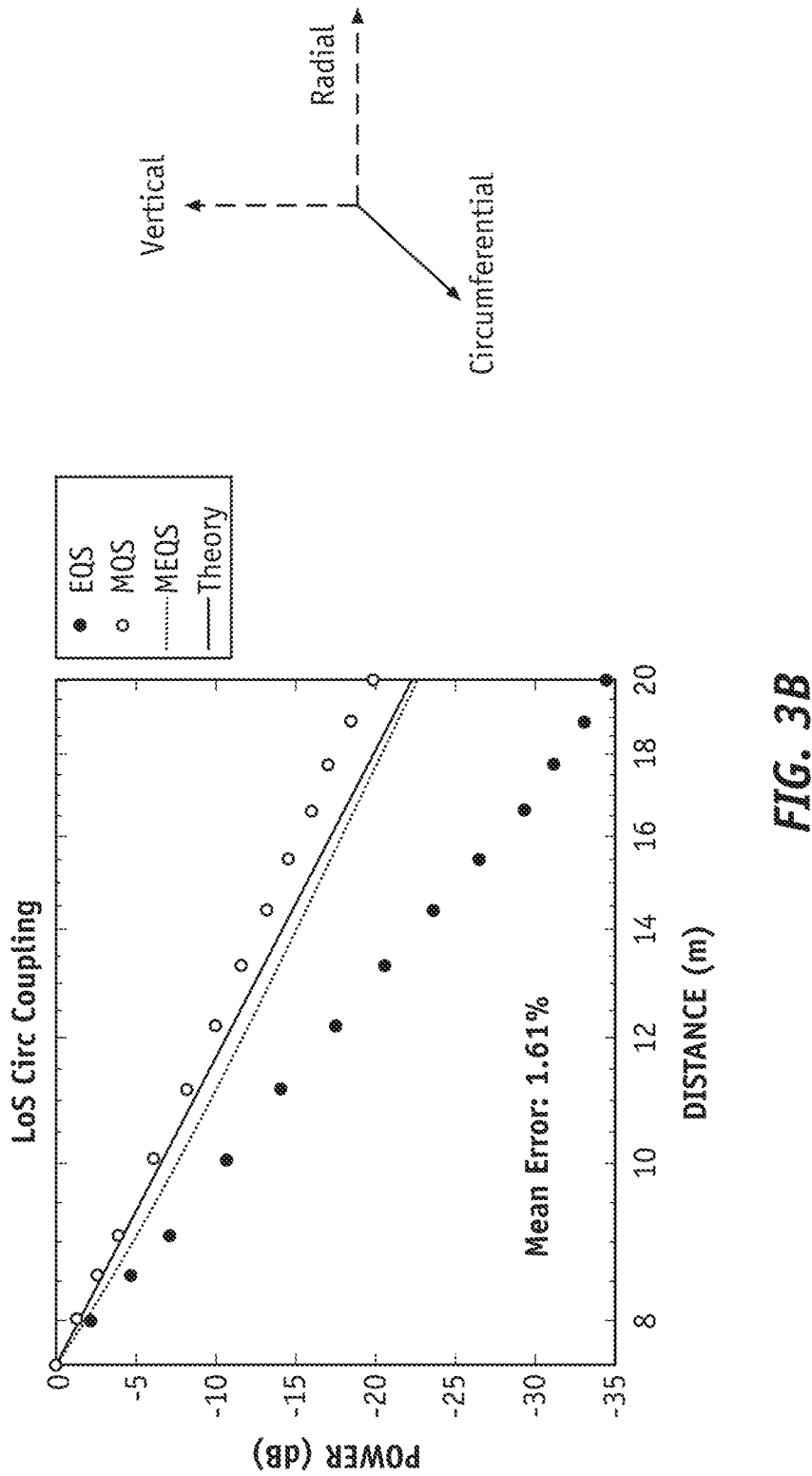
Figure 3C:
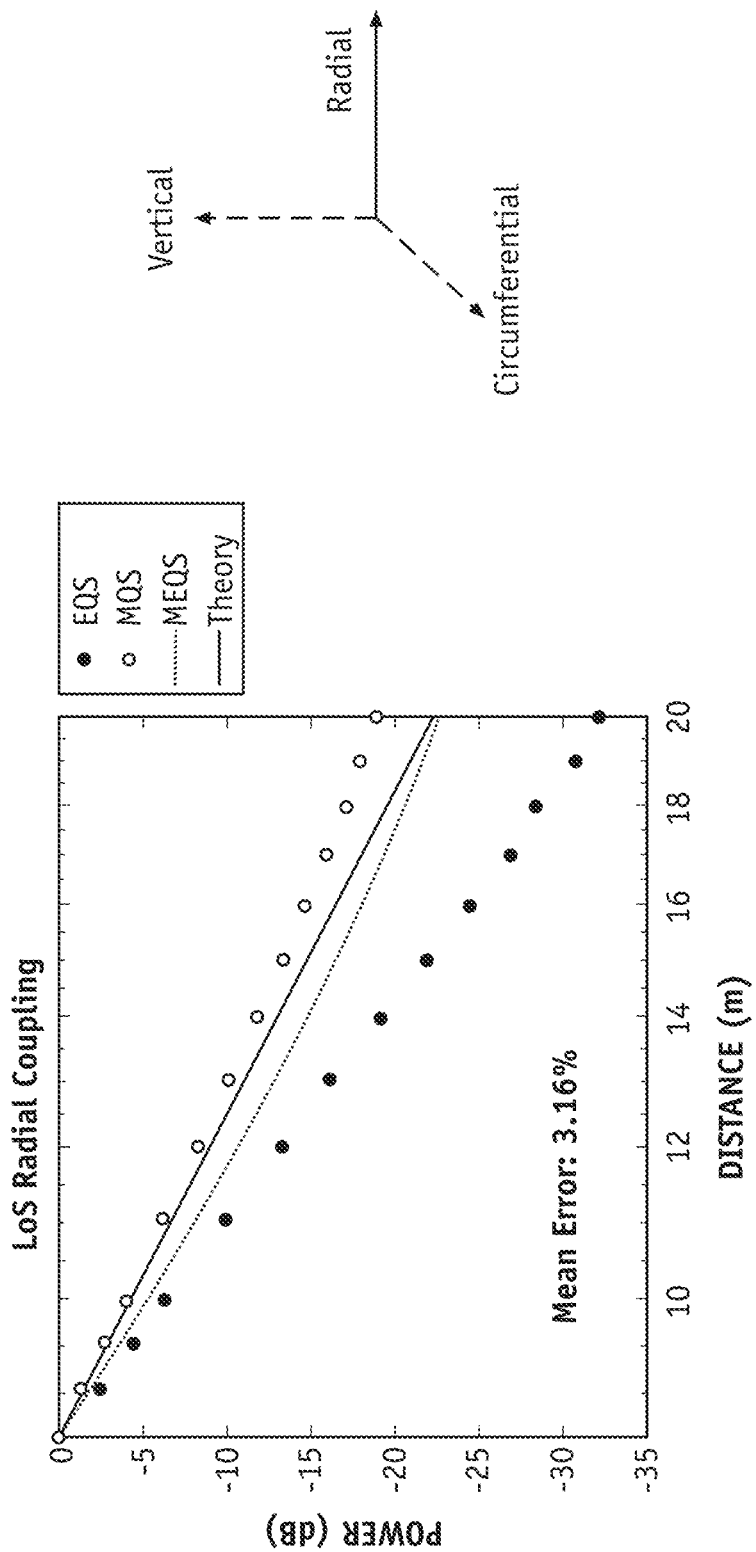

FIGS. 3A-3C show line-of-sight measurement results for three orthogonal axes (i.e. three different orientations). For all three axes, the figures above show four curves, each curve representing the measured power (in dB) vs. the distance between transmitter (101) and receiver (102), while lossy element (103) is absent in the setup. As shown in the legend of each of FIGS. 3A-3C, the four curves illustrate the measured EQS field, the measured MQS field, the combined MEQS calculation, and the theoretical curve for an ideal radiator in free-space. FIGS. 3A-3C represent the above-mentioned results in vertical, circumferential, and radial orientation respectively. For the sake of clarity in each of FIGS. 3A-3C, the corresponding orientation is represented by a solid arrow at the right-hand side of the figure.

With continued reference to FIGS. 3A-3C, it can be noticed that the vertical coupling results (FIG. 3A) showed a near perfect match with theory, as the mean error measured was 0.0074%. The circumferential and radial measurements (FIGS. 3B-3C respectively) showed mean inversion errors of 1.61% and 3.16% respectively.

As mentioned previously, the disclosed MEQS concept aims to remove artifacts from the environment to mimic the free-space environment. In what follows, several experimental results highlighting the achieved performances after implementing of the teachings of the present disclosure are presented.

1.B Experimental Results, Non-Line-of-Sight

Similarly to the case of line-of-sight measurements as explained above, non-line-of-sight measurements were taken in the same configuration as shown in FIG. 1A, with this time, the lossy element (103) placed, for example, 9 meters away from transmitter (101). MEQS field corrections were calculated using the same process as stated before and based on equations 1-3.

Figure 4A:
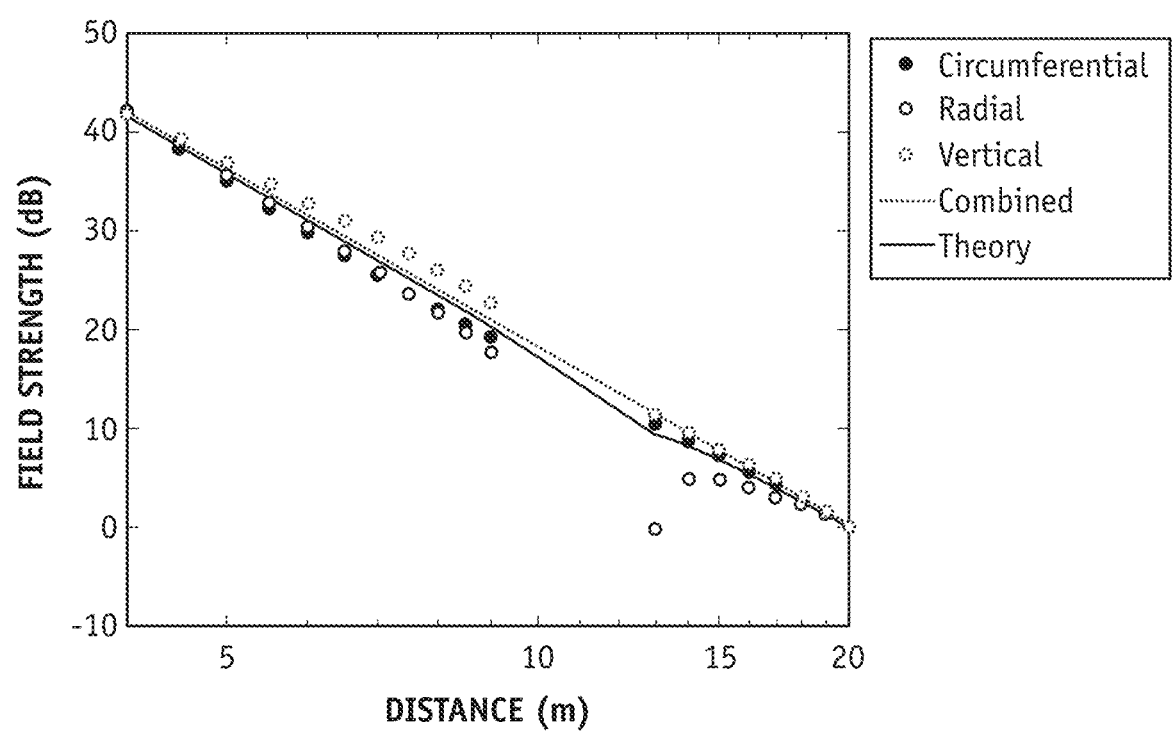
FIGS. 4A-4C show exemplary non-line-of-sight measurement results for three orthogonal axes according to an embodiment of the present disclosure.
Figure 4B:
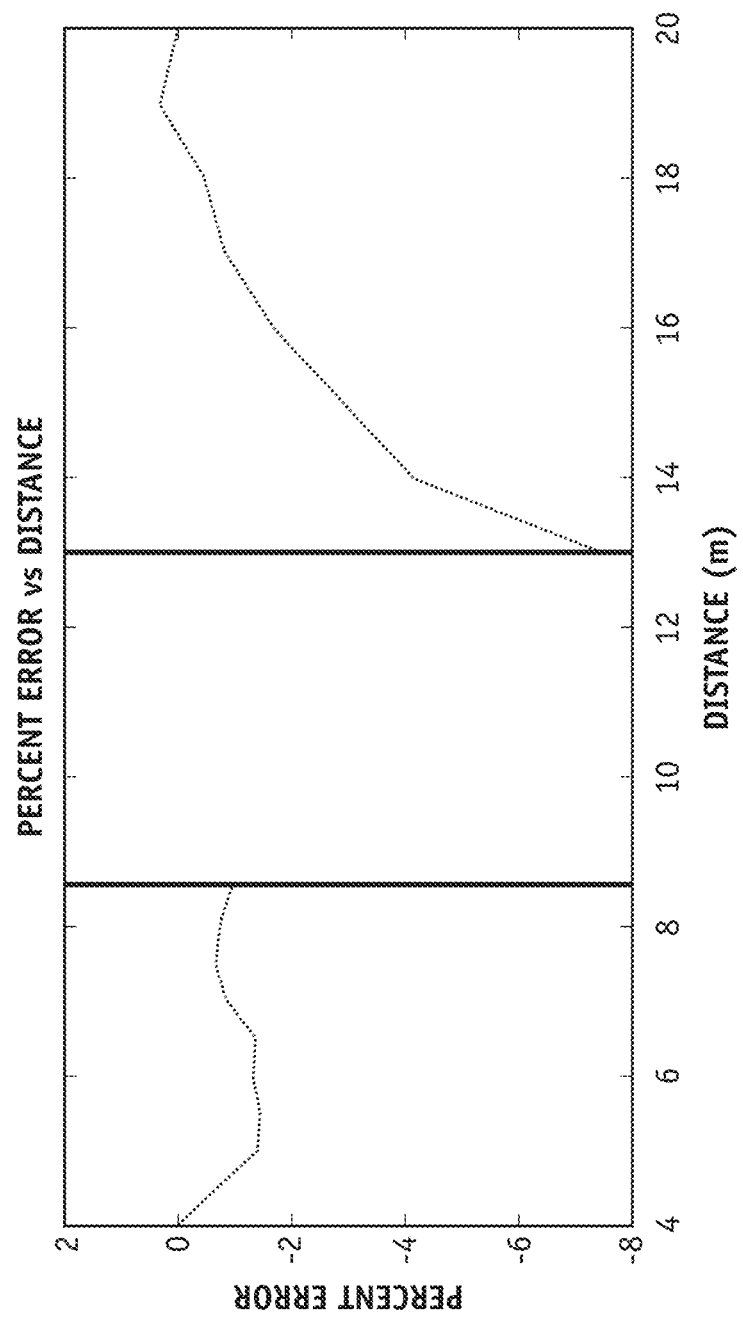
Figure 4C:
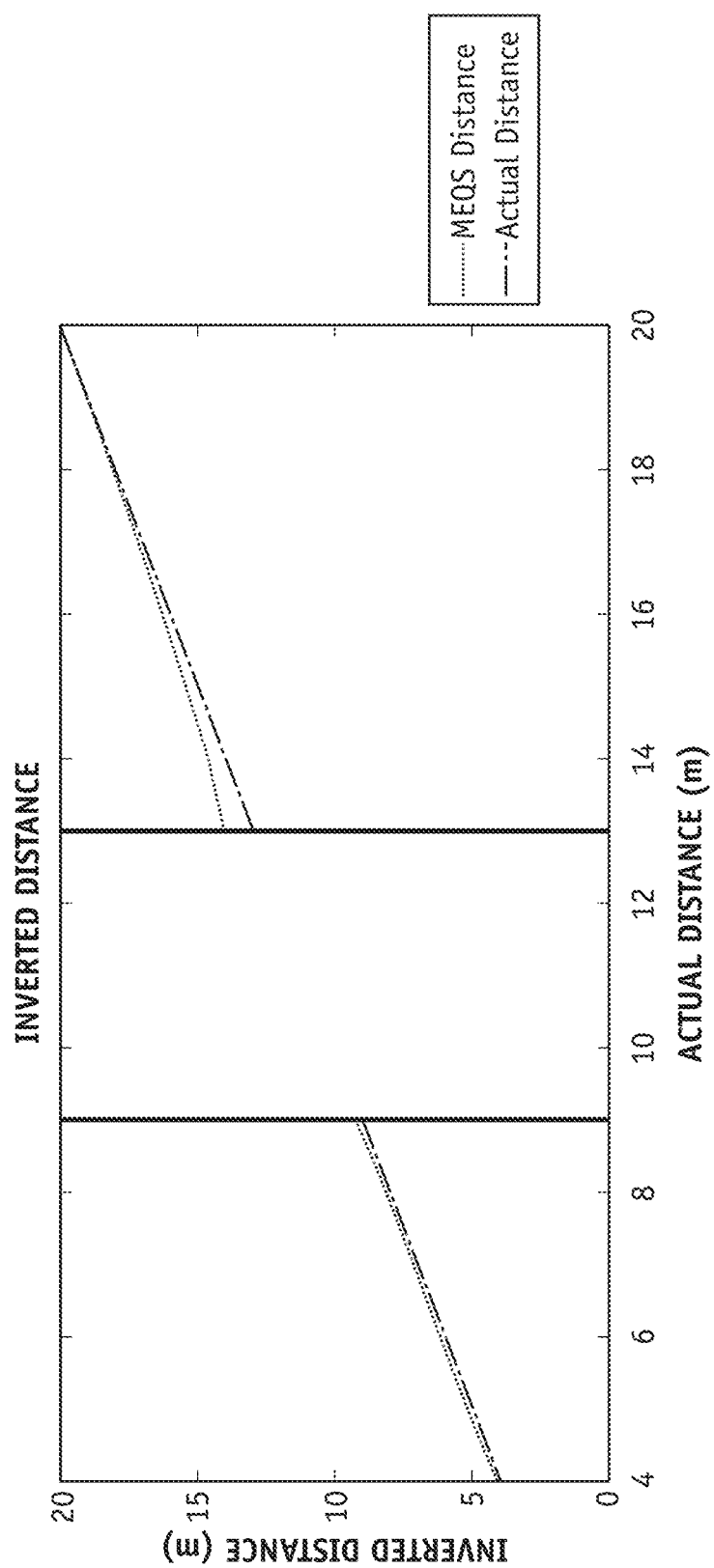

FIG. 4A shows the MEQS fields collected and processed for each component. With reference to FIG. 1A, the curves shown in FIG. 4A represent the measured power at the receiver (102) of FIG. 1A vs. the distance between transmitter (101) and receiver (102) of FIG. 1A. As it can be noticed, the greatest errors were in the radial component, with a maximum deviation at positions closest to lossy element (103) of FIG. 1A. FIG. 4B shows the percent error vs. the distance between transmitter (101) and receiver (102) of FIG. 1A. In accordance with embodiments of the present disclosure, the MEQS corrections may be applied to the three orthogonal components and combined and inverted to find range. FIG. 4C shows the inverted distance vs. the actual distance between transmitter (101) and receiver (102) of FIG. 1A. With reference to FIG. 4B, the greatest error comes out to 7%, which is within the 10% error requirement for blockage of large metal containers. According to the teachings of the present disclosure, lossy element (103) of FIG. 1A can be a metallic container with a depth of around 4m along an axis that connects transmitter (101) and receiver (102) of FIG. 1A.

Figures 5B, 5C, 5D:
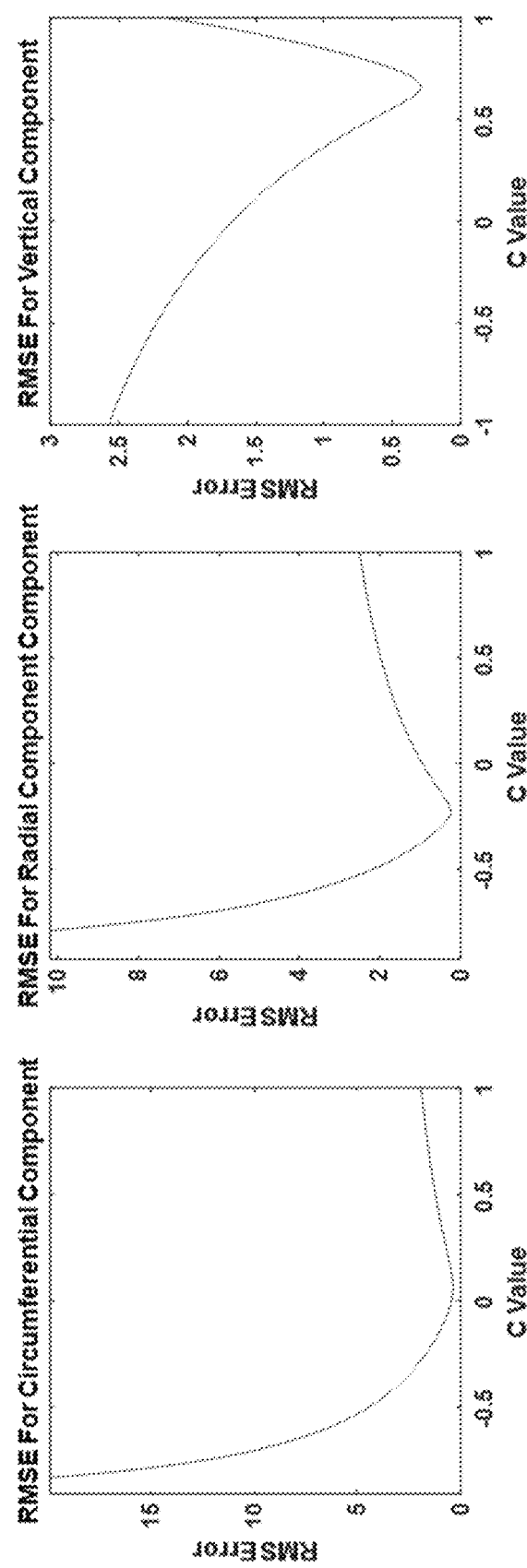
FIGS. 5B-5D shows exemplary plots of the calculated root mean square errors vs. a tuning parameter values for circumferential, radial and vertical components according to an embodiment of the present disclosure.

The disclosed MEQS concept involves two constants. The two sources of constants are for the calibration of the system and the tuning parameter to weight the electric and magnetic fields. The calibration constants are calculated to normalize the six magnetic and electric fields generated so that they can be compared to one another. These system calibrations may be done in lab and are not expected to change over long durations of time. The tuning parameter C (equations 2-3) may be used to weight the magnetic and electric field values of the same orientation for their use in MEQS. To study the sensitivity of the technique, the tuning parameters was swept between values of −0.5 to 0.5. Absolute range errors were calculated for different values and are tabulated in table (500) of FIG. 5A. As the tuning parameter was swept for each axis, the MEQS equations were applied the obtained results were then compared to those of an ideal dipole in free space. The root mean square error was calculated for each orthogonal axis. FIGS. 5B-5D shows plots of the calculated root mean square errors vs. the swept C values for circumferential, radial and vertical components respectively. Based on such curves, the preferred tuning parameter values in accordance with the teachings of the present disclosure are selected. Such preferred C values are tabulated in table 500E of FIG. 5E.

2. One Dimension, Three Orthogonal Axis System

The measurement arrangement for this case is similar to what was described with regards to measurement arrangement (100A) of FIG. 1A, except that for this case, transmitter (101) and receiver (102) are three orthogonal axis transmitter and receiver respectively. As will be described in detail, the measurement arrangement is similar to the one-axis system described previously, but a triaxial MEQS transmitter and receiver were used. According to the teachings of the present disclosure, the triaxial system may be used to solve for range that is independent of orientation or direction angles, which is a desired property in position and orientation sensing technologies.

Measurements were taken in the same fashion as described with regards to measurement arrangement (100A) of FIG. 1A, measuring the scene with both line of sight, i.e. in the absence of lossy element (103), and line of sight blockage, i.e. with lossy element (103) present, and all three orthogonal axis values were measured. The mean errors for line of sight and line of sight blockage were measured to be 1.44% and 2.3% respectively.

In order to implement the MEQS 3-axis system, the exemplary one-axis measurement system (200) of FIG. 2 may be modified to support three simultaneous configurations. As such, three EQS transmitters similar to EQS transmitter (211') and three MQS transmitters similar to MQS transmitter (211) may be used. Moreover, in order to implement three orthogonal transmission axes, three EQS transmit antennas similar to transmit antenna (233) may be used. Such antennas may be oriented perpendicular to each other. Similarly, three MQS loops similar to loop (222) may be used and the three loops may be oriented perpendicular to each other. The EQS transmit antennas may be separated by, for example 1m, to minimize interference. This distance offset may be accounted for in post-processing to ensure a proper calculation of the MEQS solution. The EQS antennas may be driven at three different frequencies (e.g. 394 kHz, 395 kHz and 407 kHz. The MQS transmit loops may also be driven at three different frequencies (e.g. 331 kHz, 361 kHz and 369 kHz) to ensure proper identification of the three axes at the receiver end. Spacing may not be used for the MQS loops because no significant interference was observed during a prior indoor experiment.

Continuing with the modifications made to measurement system (200) of FIG. 2 to realize a triaxial system, on the receive end, both the above-mentioned EQS antennas and MQS loops may be duplicated and implemented to provide the same functionalities as dipole (250) and loop (240) respectively while providing a triaxial receive end. ADC (261) may be configured to simultaneously sample 6 channels, thereby enabling appropriate measurements for all 6 field components. Measurements were done simultaneously on all channels at, for example, 1250 kHz sampling rate. Using a Matlab® script, the peaks of all three frequencies for both EQS and MQS that was measured by the receivers was stored for post-processing.

2.A Experimental Results, Line-of-Sight

Figure 6A:
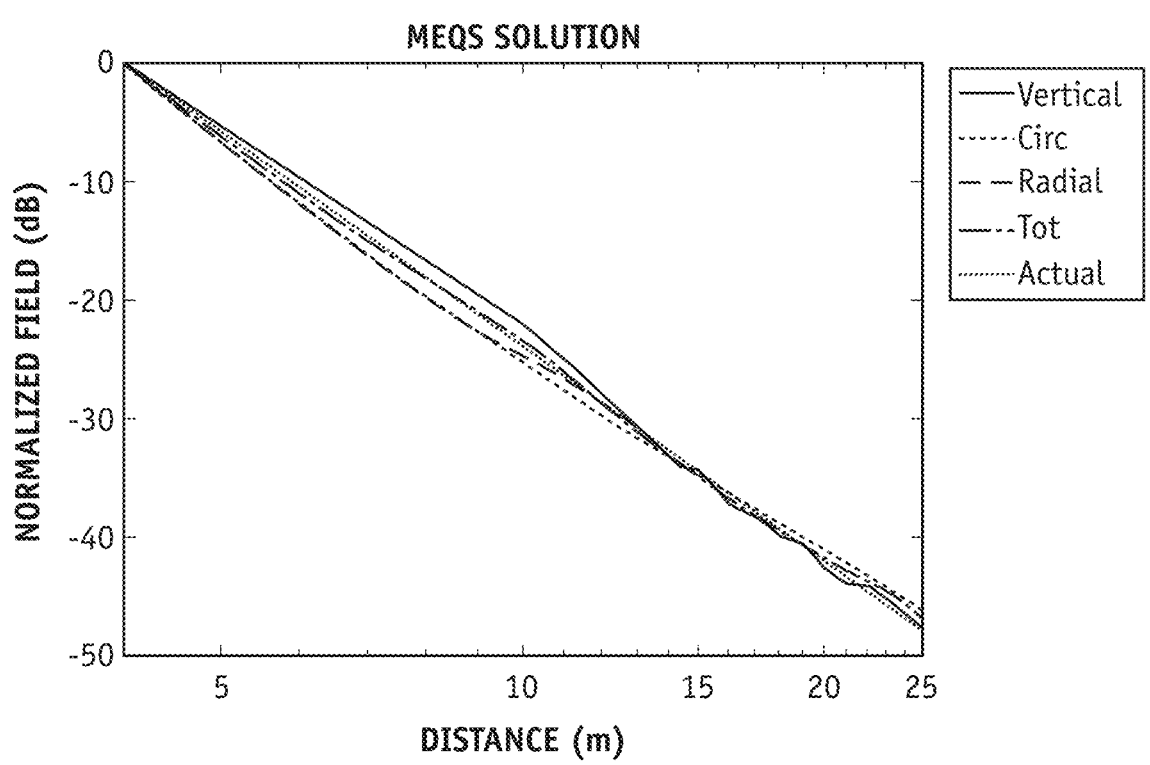
FIGS. 6A-6D shows exemplary line-of-sight measurement results according to an embodiment of the present disclosure.
Figure 6B:
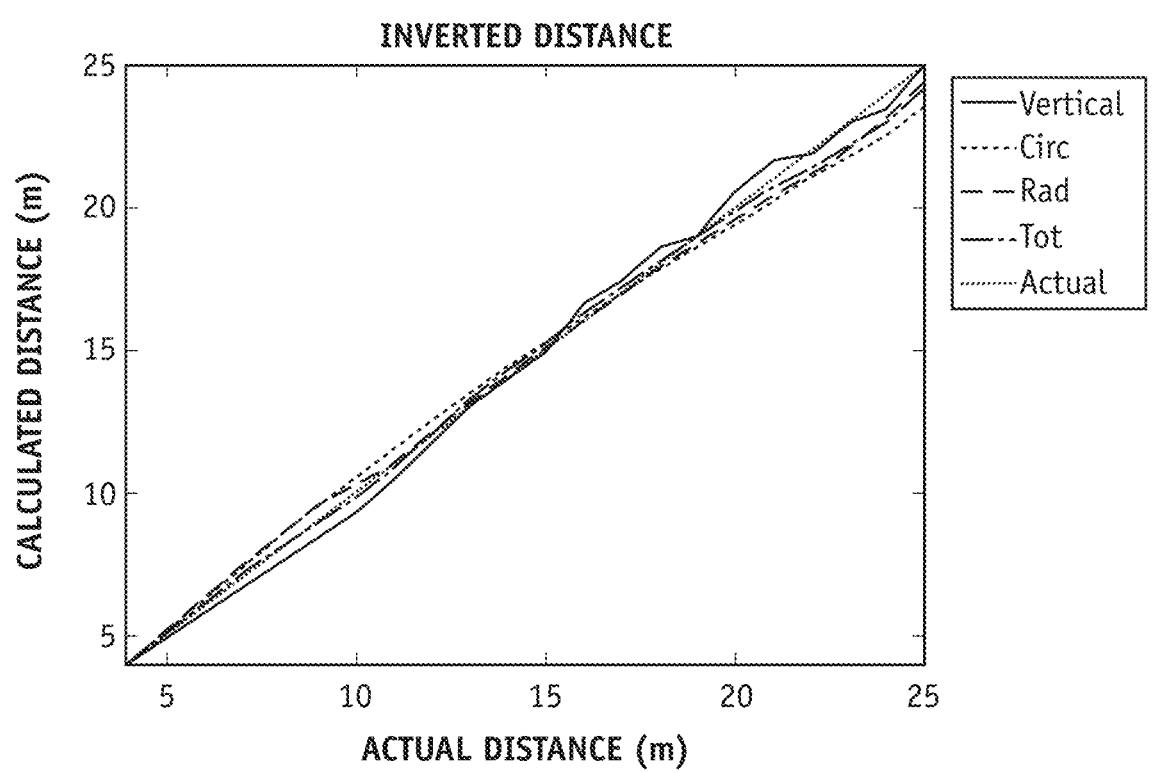
Figure 6C:
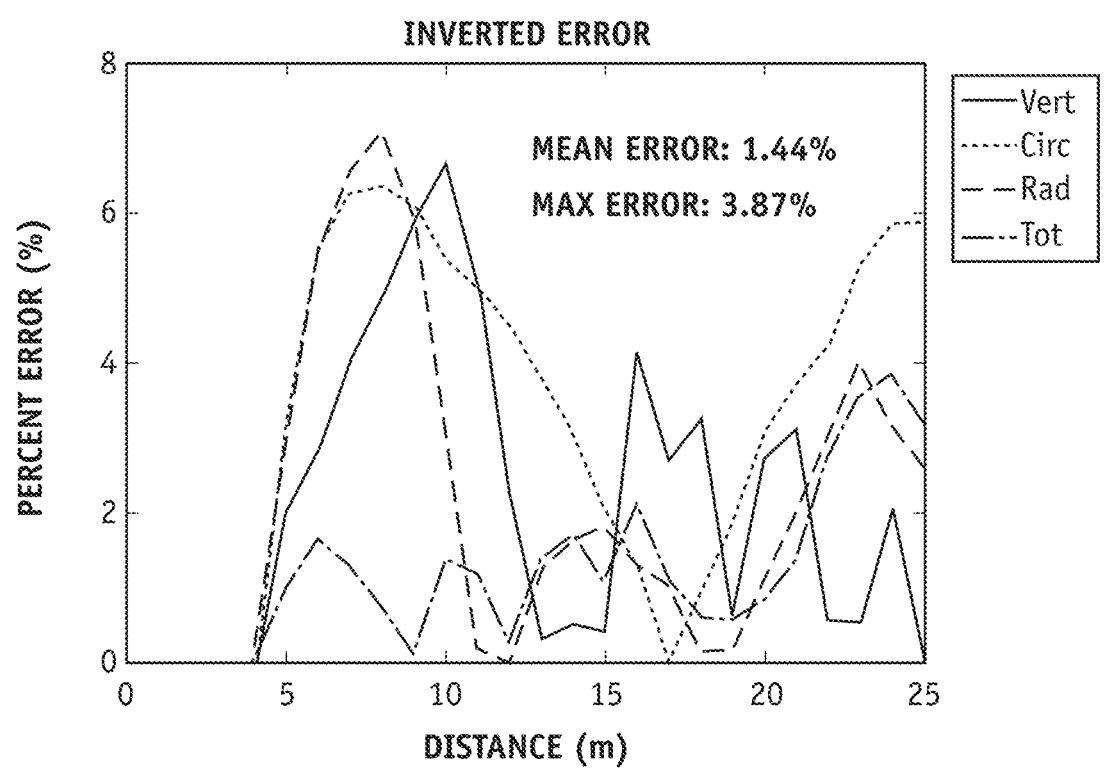
Figure 6D:
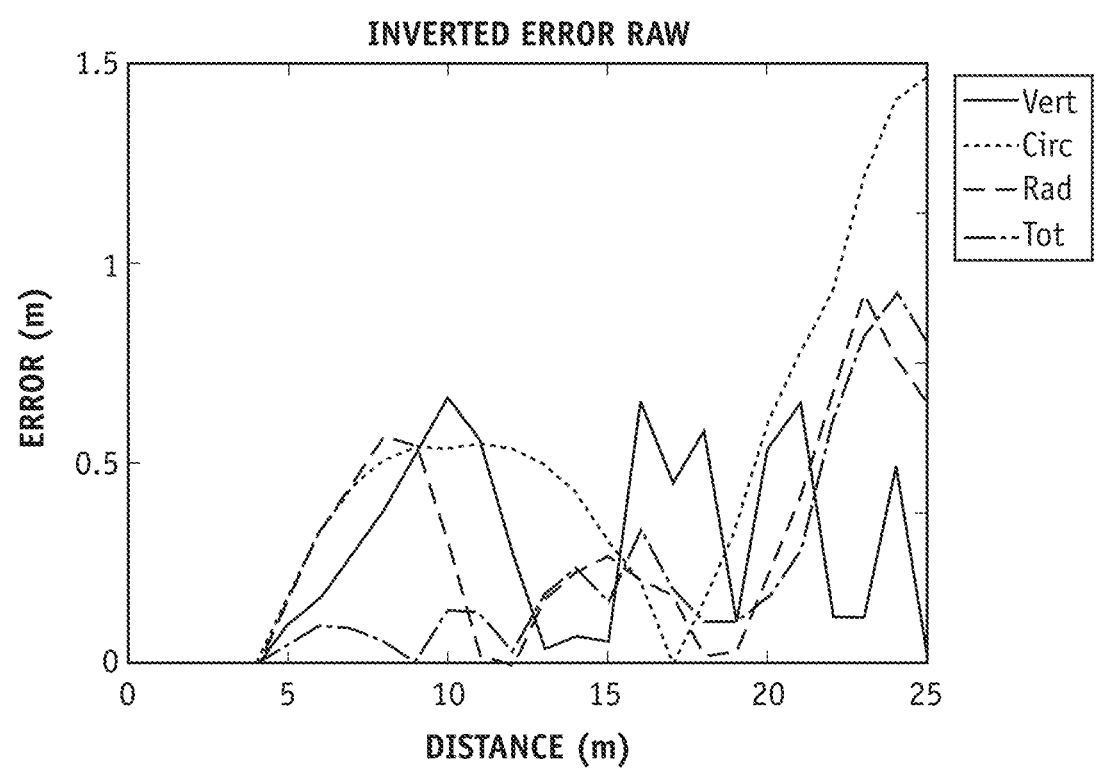

Referring back to FIG. 1A, a line-of-sight experiment was first performed, where the triaxial system as described above was implemented without placing lossy element (103) as a blockage. The triaxial system was positioned in discrete steps, and field values were measured at such steps. FIG. 6A represents MEQS solutions illustrating the normalized measured filed at the receiver in dB vs. the distance between the transmitter and the receiver. The five calculated values are the vertical, circumferential, radial, combined MEQS solutions, and the actual values. As can be seen by the error figures, while the individual components show a larger error, the combined field results are in line with a desired requirement value which is around 5%. The maximum error in percentage is 3.87%, while the mean error was 1.44%, which is below the desirable 5% requirement. Similar to what was mentioned before for the case one-axis system, the range can be estimated by inverting the MEQS solutions. FIG. 6B shows the calculated distance vs. the actual distance between the transmitter and the receiver for different orientations. FIG. 6C shows the percentage error of the MEQS solutions vs. the distance between the transmitter and the receiver. FIG. 6D shows the inversion error vs. the distance between the transmitter and the receiver.

2.B Experimental Results, Non-Line-of-Sight

With reference to FIG. 1A, similarly to what described in section 1.B for the one-axis system, non-line-of-sight experiment was also performed for the triaxial system wherein lossy element (103) was this time placed between 10 and 13 meters. The maximum error observed was 6%, with correlates to 1.25 m as this was measured at 25 meters away. The mean error was measured as 0.41 m or a total of 2.3%. This is will within a desirable requirement of 10%.

Figure 7A:
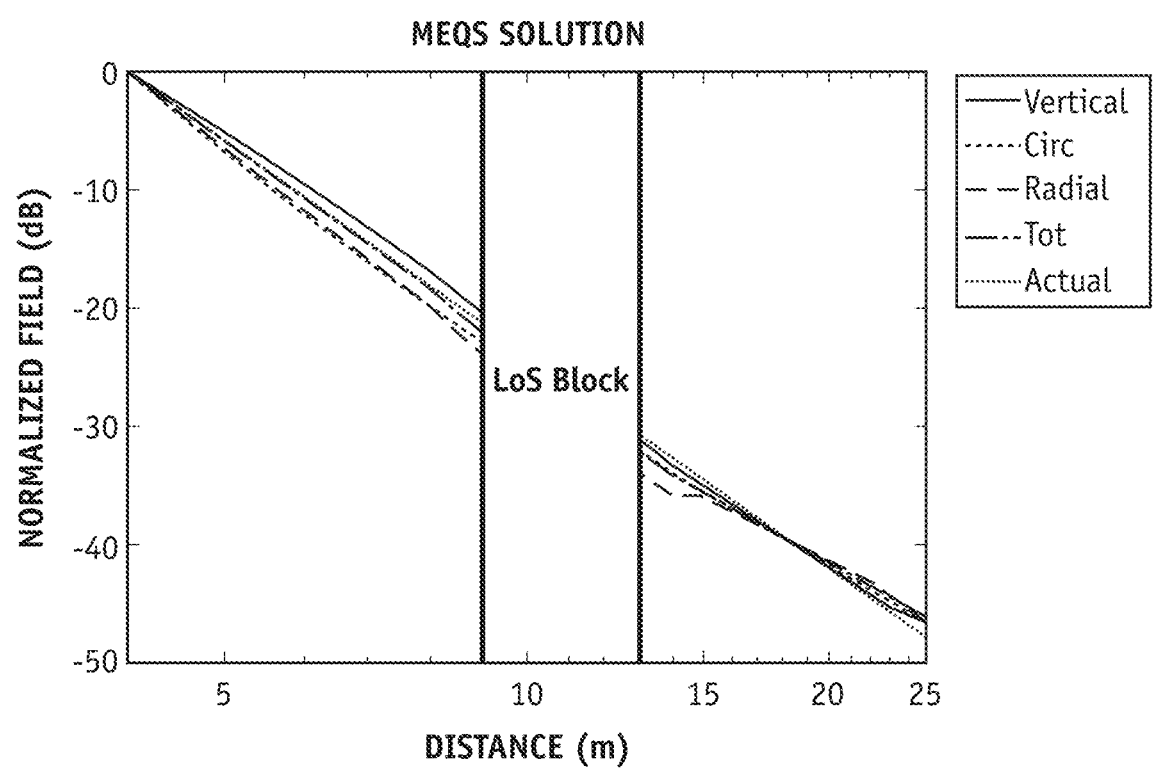
FIGS. 7A-7D shows exemplary non-line-of-sight measurement results according to an embodiment of the present disclosure.
Figure 7B:
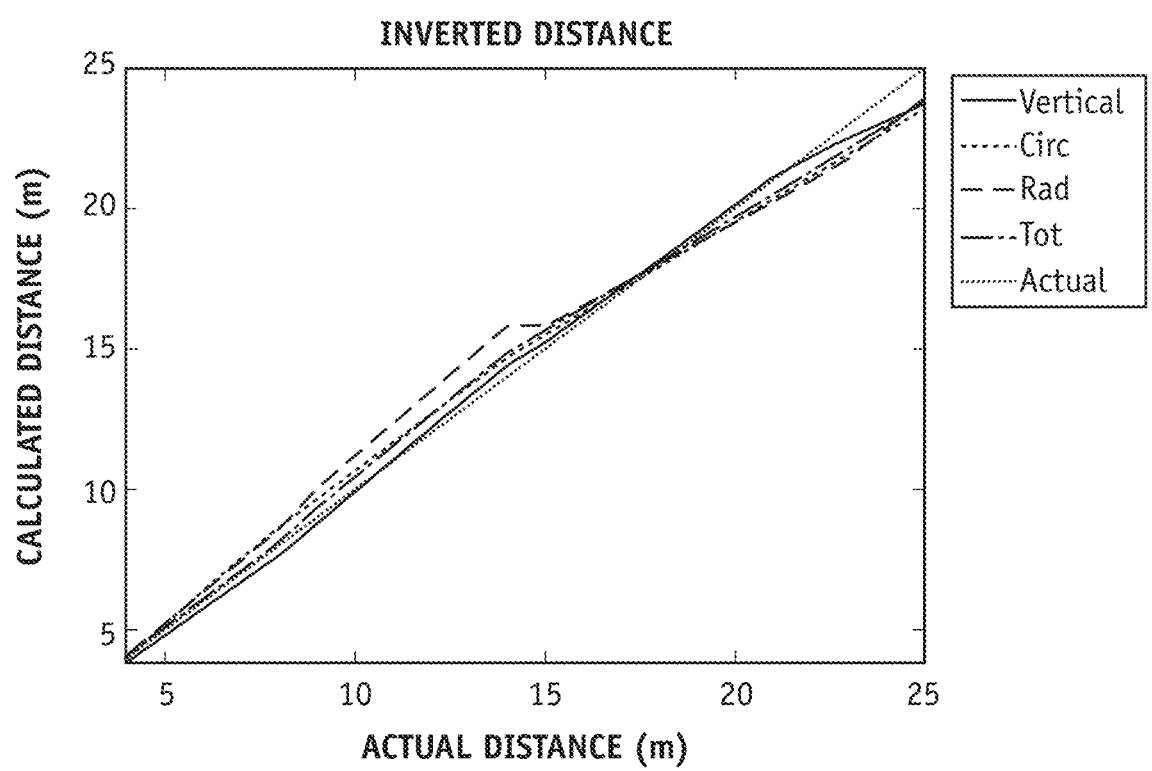
Figure 7C:
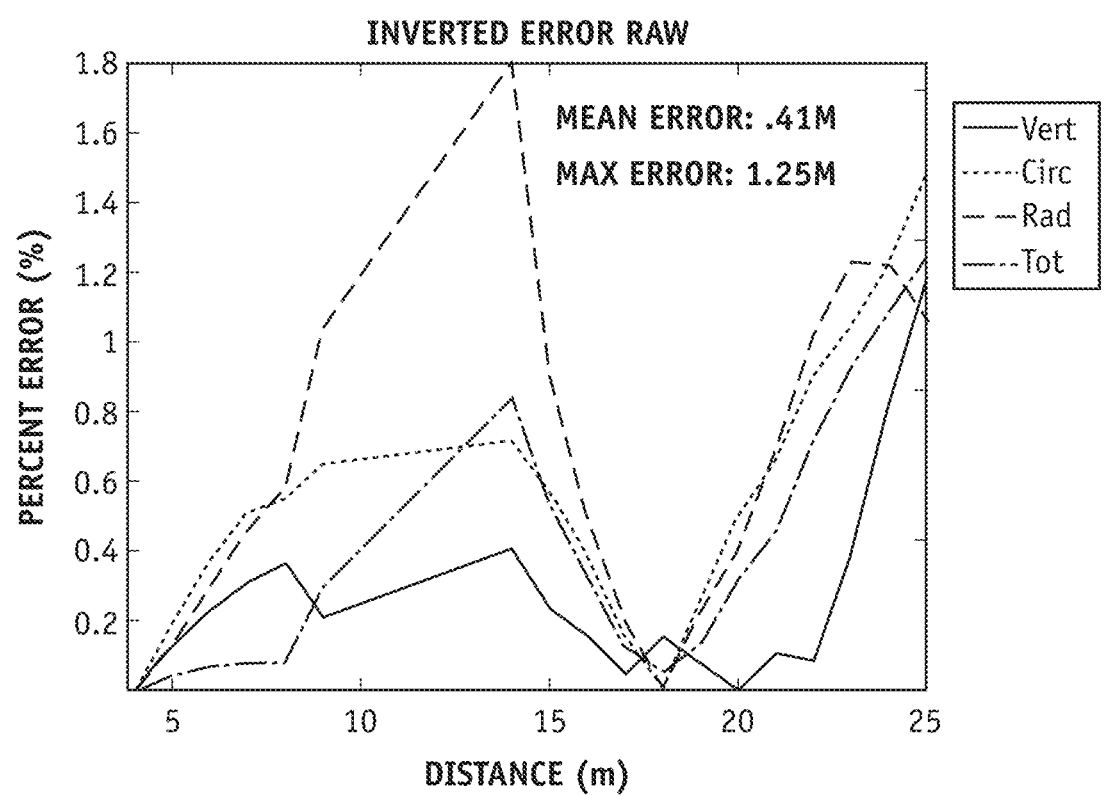
Figure 7D:
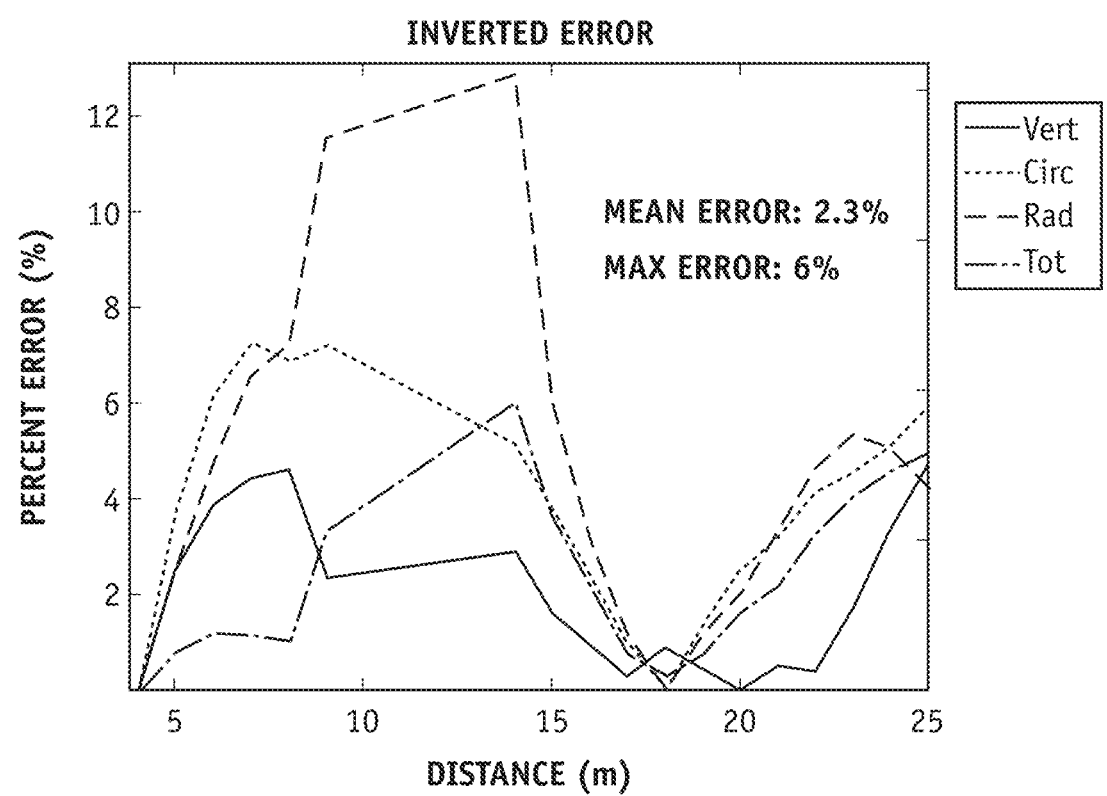

FIG. 7A shows the normalized estimated filed in dB vs. distance, and FIG. 7B shows the inverted distance vs. the actual distance between the transmitter and the receiver for various orientations. FIGS. 7C-7D show the absolute error and the percentage error of the estimated inverted distance vs. the actual distance respectively.

As mentioned previously, by virtue of considering the effects of both magnetic and electric fields the disclosed methods provide improved results in terms of estimation errors. Greater errors can be observed when a range inversion is applied to both the magnetic and electric field separately. Based on how the image currents are generated, both in the ground and on a given target in the scene, the magnetic and electric field react in opposing ways. Where the circumferential and radial components of the magnetic field are additive, and see a slower decay than the theory curve, these field orientations are destructive in the electric field, thus causing the fields to degrade faster than theory. This effect is also seen in the vertical components, but is additive for the electric field, and destructive for the magnetic. Without applying the MEQS technique to the given fields, accounting for these artifacts becomes difficult and extreme range errors found. As previously described, by combining both the magnetic and electric field, the effects of the environment are mitigated due to the field.

Figure 8B:
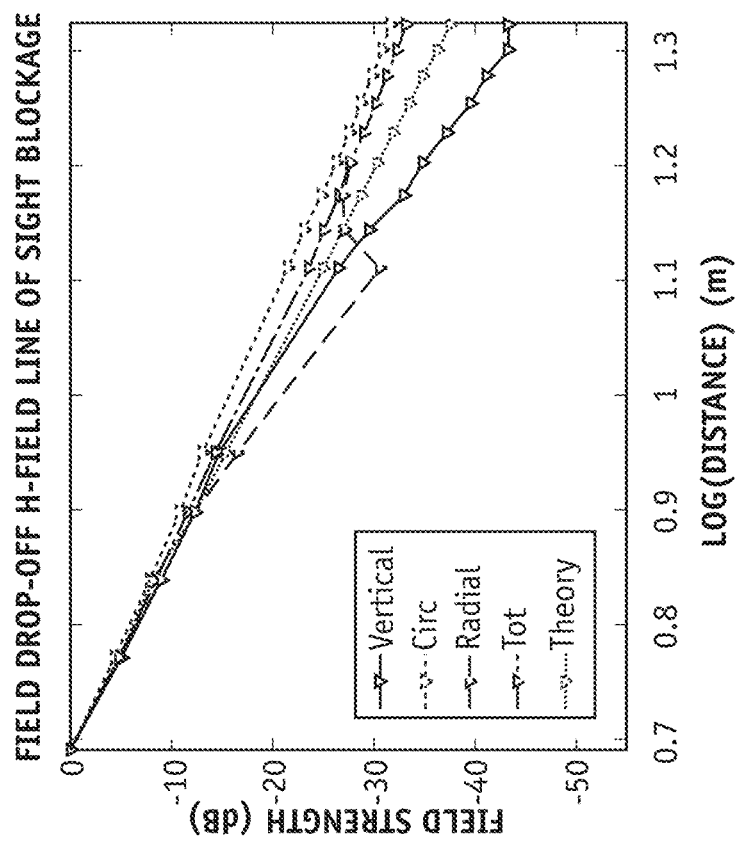
FIGS. 8A-8D shows non-line-of-sight measurements results for separate magneto-quasi-static and electric-quasi-static fields.
Figure 8A:
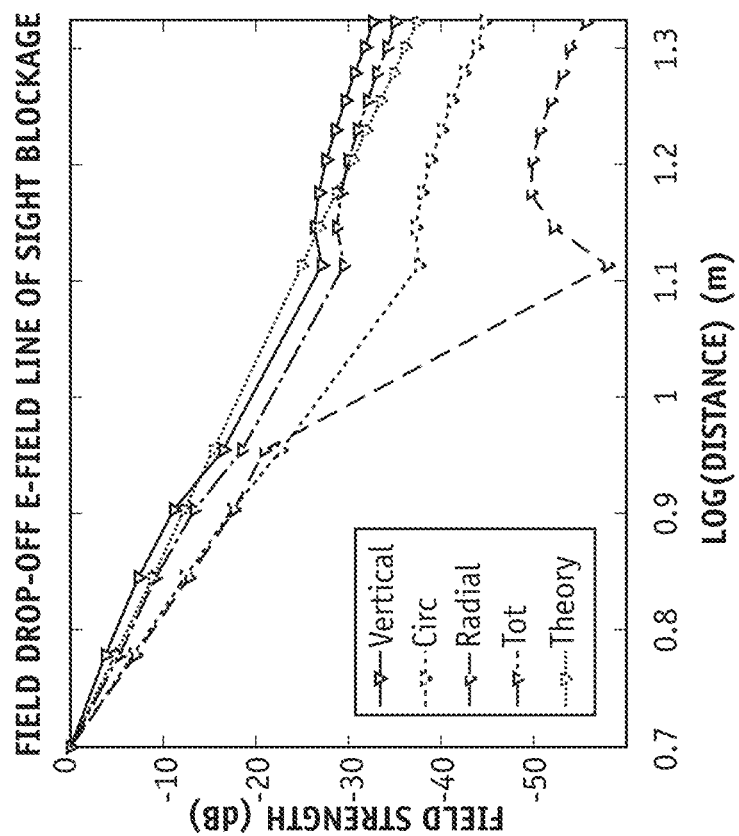
Figures 8C, 8D:
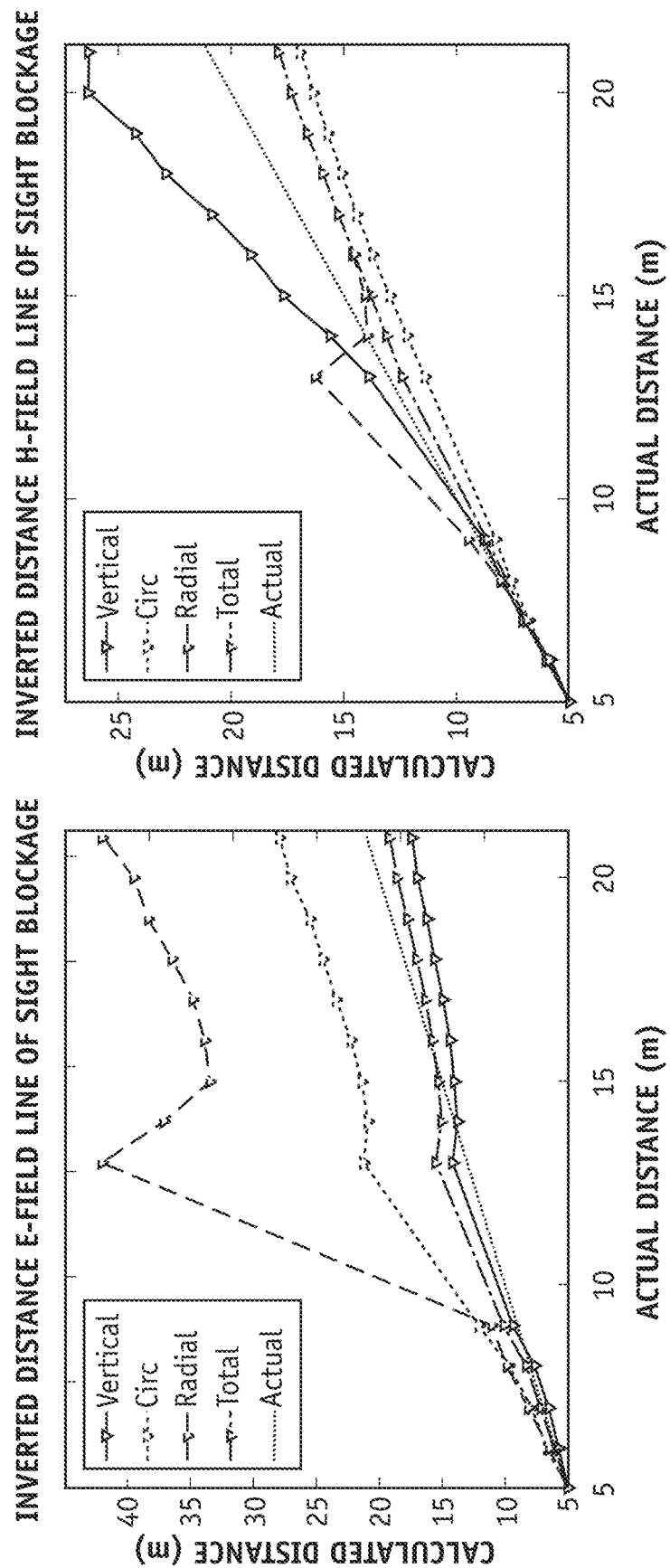

FIGS. 8A-8B show the estimated field strength vs. the distance (in logarithmic scale) between the transmitter and the receiver for the electric and magnetic fields respectively, and in the case of a non-line-of-sight experiment. FIGS. 8C-8D show the calculated distance vs. the actual distance (in logarithmic scale) between the transmitter and the receiver taking into account only the electric and only magnetic fields respectively, and in the case of a non-line-of-sight experiment.

Figure 9B:
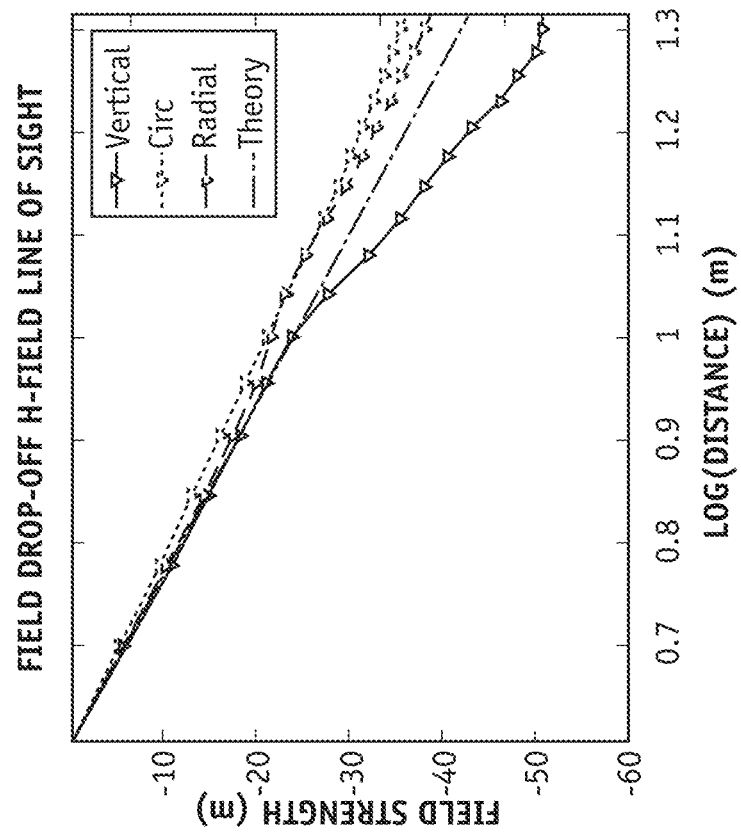
FIGS. 9A-9D shows line-of-sight measurements results for separate magneto-quasi-static and electric-quasi-static fields.
Figure 9A:
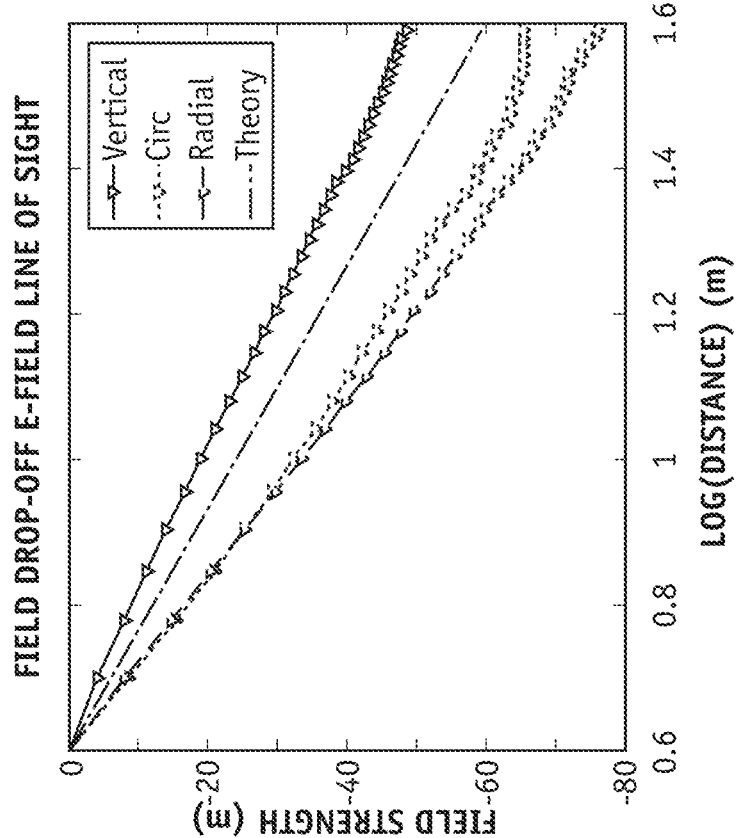
Figures 9C, 9D:
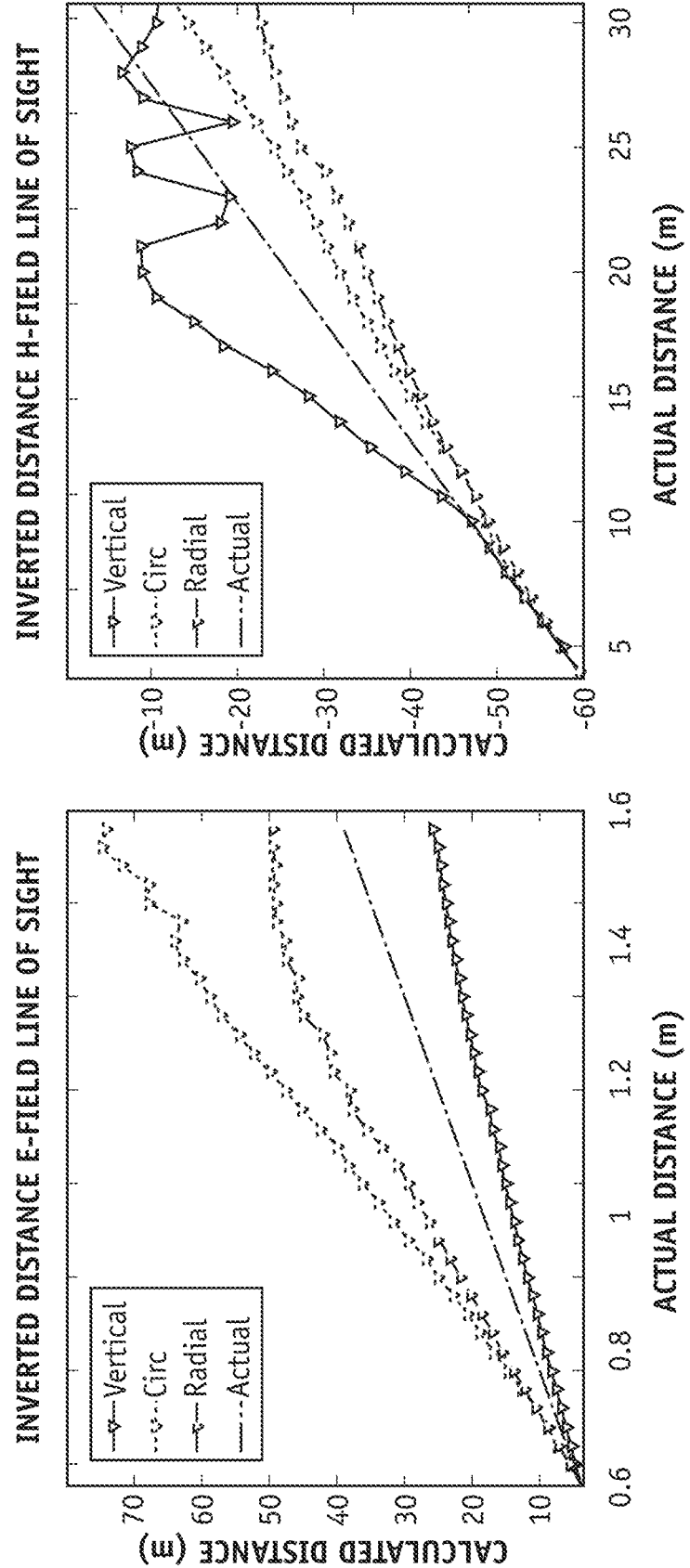

FIGS. 9A-9B show the estimated field strength vs. the distance (in logarithmic scale) between the transmitter and the receiver for the electric and magnetic fields respectively, and in the case of a line-of-sight experiment. FIGS. 9C-9D show the calculated distance vs. the actual distance (in logarithmic scale) between the transmitter and the receiver taking into account only the electric and only magnetic fields respectively, and in the case of a non-line-of-sight experiment.

The performance of the disclosed methods described in the case of the one-dimensional ranging problem for simplicity. Using, for example, the teachings of the U.S. application Ser. No. 16/987,205 filed on Aug. 8, 2020, which is incorporated herein by reference in its entirety, it is understood that the disclosed methods, concepts and devices may be used to solve for Multi-dimensional, including 2-dimensional and 3-dimensional positions in addition to one-dimensional position as previously described in detail, and
Orientation and directions angles.

It is also understood that using the teachings of the above-mentioned incorporated application, embodiments in accordance with the teachings of the present disclosure may also be envisaged wherein two or more transmitting devices and/or two or more receiving devices are implemented. According to further embodiments of the present disclosure, the receiving devices implemented in any of the mentioned cases, i.e. one or two or three-dimensional systems, may be mobile receiving devices.

In accordance to yet other embodiments of the present disclosure, the EQS and/or MQS transmitters may transmit along one or more transmit axes and the one or more transmit axes may include three orthogonal axes. Moreover, the EQS and/or MQS receivers may receive along one or more receiving axes and the one or more receiving axes may include three orthogonal axes.

Due to ability to remove sources of errors in quasi-static position and orientation sensing techniques, the described MEQS technique provides higher accuracy in non-line-of-sight environments where metals and conductors are present. By combining MQS and EQS and using the disclosed method to combine the two fields, the MEQS technique enables the reduction of these sources of error.

The methods and systems described in the present disclosure may be implemented in hardware, software, firmware or any combination thereof. Features described as blocks, modules or components may be implemented together (e.g., in a logic device such as an integrated logic device) or separately (e.g., as separate connected logic devices). The software portion of the methods of the present disclosure may comprise a computer-readable medium which comprises instructions that, when executed, perform, at least in part, the described methods. The computer readable medium may comprise, for example, a random access memory (RAM) and/or a read-only memory (ROM). The instructions may be executed by a processor, e.g., a digital signal processor (DSP), an application specific integrated circuit (ASIC), a field programmable logic array (FPGA), a graphic processing unit (GPU) or a general purpose GPU.

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure, and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The invention claimed is:

1. A non-line-of-sight system comprising:
a transmitting device configured to transmit combined magneto-electric-quasi-static fields along one or more transmitting axes, the transmitting device further configured to transmit, through a non-line-of-sight environment including a lossy element, the magneto-electric-quasi-static fields in one or more frequency bands; and
a receiving device configured to receive and detect the magneto-electric-quasi-static fields transmitted through the non-line-of sight-environment along one or more receiving axes,
wherein:
based on the detected magneto-electric-quasi-static fields, the system is configured to calculate an orientation-invariant range between the receiving device and the transmitting device, and the magneto-electric-quasi-static fields include a combination of separate electric-quasi-static fields and magneto-quasi-static fields.

2. The system of claim 1, wherein the one or more transmitting axes comprise an electric-quasi-static transmitting axis and a magneto-quasi-static transmitting axis parallel to the electric-quasi-static transmitting axis.

3. The system of claim 2, wherein the one or more receiving axes comprise an electric-quasi-static receiving axis and a magneto-quasi-static receiving axis parallel to the electric-quasi-static receiving axis.

4. The system of claim 1, wherein the one or more transmitting axes are three orthogonal transmitting axes, and the one or more receiver axes are three orthogonal receiving axes.

5. The system of claim 1, wherein calculating the orientation-invariant ranges comprises calculating a weighted sum of detected electric-quasi-static fields and magneto-quasi-static fields.

6. The system of claim 5, wherein the calculating the weighted sum involves a tuning parameter to weight magnitudes of the electric field with respect to magnitudes of the magnetic field.

7. The system of claim 5, wherein the calculating further includes inverting the weighted sum to calculate the orientation-invariant ranges.

8. The system of claim 7, wherein the calculating further includes calculating a position of the receiving device based on the calculated orientation-invariant ranges.

9. The system of claim 1, wherein the calculating comprises consideration of perturbations caused by ground of the magneto-electric-quasi-static fields.

10. The system of claim 1, the system being a one-dimension, one-axis position sensing system.

11. The system of claim 10, wherein dimensions of the lossy element are substantially smaller than a transmission wavelength.

12. The system of claim 10, wherein:
the transmitting device comprises an electric-quasi-static transmitter, and a magneto-quasi-static transmitter, the electric-quasi-static transmitter configured to transmit electric-quasi-static fields along an electric-quasi-static transmitting axis, and the magneto-quasi-static transmitter configured to transmit magneto-quasi-static fields along an magneto-quasi-static transmitting axis;
the receiving device comprises an electric-quasi-static receiver, and a magneto-quasi-static receiver, the electric-quasi-static receiver configured to receive electric-quasi-static fields along an electric-quasi-static receiving axis, and the magneto-quasi-static transmitter configured to transmit magneto-quasi-static fields along a magneto-quasi-static receiving axis.

13. The system of claim 12, wherein the electric-quasi-static transmitter and the magneto-quasi-static transmitter are oriented in parallel, and wherein the electric-quasi-static receiver and the magneto-quasi-static receiver are oriented in parallel.

14. The system of claim 12, further comprising a processing unit including an analog to digital converter to convert received fields to digital signals to be processed.

15. The system of claim 1, the system being a one-dimension, three orthogonal axis position sensing system.

16. The system of claim 15, wherein the transmitting device comprises:
a first electric-quasi-static transmitter, and a first magneto-quasi-static transmitter, the first electric-quasi-static transmitter configured to transmit electric-quasi-static fields along a first electric-quasi-static transmitting axis, and the first magneto-quasi-static transmitter configured to transmit magneto-quasi-static fields along a first magneto-quasi-static transmitting axis;
a second electric-quasi-static transmitter, and a second magneto-quasi-static transmitter, the second electric-quasi-static transmitter configured to transmit electric-quasi-static fields along a second electric-quasi-static transmitting axis, and the second magneto-quasi-static transmitter configured to transmit magneto-quasi-static fields along a second magneto-quasi-static transmitting axis; and
a third electric-quasi-static transmitter, and a third magneto-quasi-static transmitter, the third electric-quasi-static transmitter configured to transmit electric-quasi-static fields along a third electric-quasi-static transmitting axis, and the third magneto-quasi-static transmitter configured to transmit magneto-quasi-static fields along a third magneto-quasi-static transmitting axis,
wherein
the first, the second and the third electric-quasi-static transmitting axes are orthogonal to one another, and
the first, the second and the third magneto-quasi-static transmitting axes are orthogonal to one another.

17. The system of claim 16, wherein:
the first electric-quasi-static transmitter comprises a first antenna transmitting along the first electric-quasi-static transmitting axis;
the second electric-quasi-static transmitter comprises a second antenna transmitting along the second electric-quasi-static transmitting axis, and
the third electric-quasi-static transmitter comprises a third antenna transmitting along the third electric-quasi-static transmitting axis.

18. The system of claim 17, wherein the first, the second, and the third antennas are disposed at least one meter apart from one another.

19. The system of claim 17, wherein:
the first magneto-quasi-static transmitter comprises a first loop transmitting along the first magneto-quasi-static transmitting axis;
the second magneto-quasi-static transmitter comprises a loop transmitting along the second magneto-quasi-static transmitting axis, and
the third magneto-quasi-static transmitter comprises a loop antenna transmitting along the third magneto-quasi-static transmitting axis.

20. The system of claim 15, wherein the receiving device comprises:
a first electric-quasi-static receiver, and a first magneto-quasi-static receiver, the first electric-quasi-static receiver configured to receive electric-quasi-static fields along a first electric-quasi-static receiving axis, and the first magneto-quasi-static receiver configured to receive magneto-quasi-static fields along a first magneto-quasi-static receiving axis;
a second electric-quasi-static receiver, and a second magneto-quasi-static receiver, the second electric-quasi-static receiver configured to receive electric-quasi-static fields along a second electric-quasi-static receiving axis, and the second magneto-quasi-static receiver configured to receive magneto-quasi-static fields along a second magneto-quasi-static receiving axis; and
a third electric-quasi-static receiver, and a third magneto-quasi-static receiver, the third electric-quasi-static receiver configured to receive electric-quasi-static fields along a third electric-quasi-static receiving axis, and the third magneto-quasi-static receiver configured to receive magneto-quasi-static fields along a third magneto-quasi-static receiving axis, wherein the first, the second and the third electric-quasi-static receiving axes are orthogonal to one another, and the first, the second and the third magneto-quasi-static receiving axes are orthogonal to one another.

21. The system of claim 15, wherein the transmitting and the receiving devices are disposed at same heights above ground.

22. The system of claim 15, wherein the transmitting and the receiving devices are disposed at different heights above ground.

23. The system of claim 15, wherein the receiving device is a mobile receiving device.

24. The system of claim 1, wherein the one or more frequency bands include frequencies in the range of tens or hundreds of kHz.

25. A non-line-of-sight system comprising:

a plurality of transmitting devices configured to transmit magneto-electric-quasi-static fields along a plurality of transmitting axes, the plurality of transmitting devices further configured to transmit, through a non-line-of-sight environment including a loss element, the magneto-electric-quasi-static fields in one or more frequency bands;

a plurality of receiving devices configured to receive and detect the magneto-electric-quasi-static fields transmitted through the non-line-of-sight environment along a plurality of receiving axes, wherein:

based on the detected magneto-electric-quasi-static fields, the system is configured to calculate orientation-invariant ranges between the plurality of receiving devices and the plurality of transmitting devices, and the magneto-electric-quasi-static includes a combination of separate electric-quasi-static fields and magneto-quasi-static fields.

26. The system of claim 25, wherein plurality of transmitting axes are three orthogonal transmitting axes, and the plurality of receiver axes are three orthogonal receiving axes.

27. The system of claim 25, wherein calculating the orientation-invariant ranges comprises calculating a weighted sum of the detected electric-magneto-quasi-static fields.

28. The system of claim 27, wherein the calculating further includes inverting the weighted sum to calculate the orientation-invariant ranges.

29. The system of claim 25, implemented for two-dimensional position and/or orientation sensing.

30. The system claim 25, implemented for three-dimensional position and/or orientation sensing.

31. A non-line-of-sight transmission system comprising:

a transmitting device configured to transmit combined magneto-electric-quasi-static fields along one or more transmitting axes, the transmitting device further configured to transmit, through a non-line-of-sight environment including a lossy element, the magneto-electric-quasi-static fields in one or more frequency bands, wherein the magneto-electric-quasi-static fields include a combination of separate electric-quasi-static fields and magneto-quasi-static fields, the magneto-electric-quasi-static fields are receivable and detectable along one or more receiving axes, and based on detected magneto-electric-quasi-static fields, the system is configured to calculate an orientation-invariant range between the transmitting device and a receiving device as a function of transmitted and received magneto-electric-quasi-static fields.

32. A non-line-of-sight receiving system comprising:

a receiving device configured to receive and detect magneto-electric-quasi-static fields transmitted in one or more frequency bands through a non-line-of sight-environment along one or more receiving axes, the non-line-of-sight environment including a loss element, wherein the magneto-electric-quasi-static fields include a combination of separate electric-quasi-static fields and magneto-quasi-static fields, based on detected magneto-electric-quasi-static fields, the system is configured to calculate an orientation-invariant range between the receiving device and a transmitting device as a function of transmitted and received magneto-electric-quasi-static fields.

* * * * *